(12) United States Patent
Peng et al.

(10) Patent No.: US 8,119,225 B2
(45) Date of Patent: Feb. 21, 2012

(54) COPPER CLAD LAMINATE, PREPREG AND METHOD OF REDUCING SIGNAL LOSS

(75) Inventors: Dai Xin Peng, Suzhou (CN); Zhuo Wang, Suzhou (CN)

(73) Assignee: Ventec Electronics (Suzhou) Company Limited, New District, Sushou, Jiangsu (CN)

( * ) Notice: Subject to any disclaimer, the term of this patent is extended or adjusted under 35 U.S.C. 154(b) by 0 days.

(21) Appl. No.: 12/700,725

(22) Filed: Feb. 5, 2010

(65) Prior Publication Data
US 2010/0248569 A1 Sep. 30, 2010

(30) Foreign Application Priority Data

Mar. 4, 2009 (CN) .......................... 2009 1 0115032

(51) Int. Cl.
*B32B 9/00* (2006.01)
(52) U.S. Cl. .................... 428/209; 442/180; 442/208
(58) Field of Classification Search ............ 428/209, 428/901; 174/250–258; 442/180, 208
See application file for complete search history.

(56) References Cited

U.S. PATENT DOCUMENTS

| | | | |
|---|---|---|---|
| 4,115,185 A * | 9/1978 | Carlson et al. | 430/318 |
| 4,803,115 A * | 2/1989 | Fushiki et al. | 442/234 |
| 4,833,204 A | 5/1989 | Yusa et al. | |
| 5,350,621 A | 9/1994 | Yuhas et al. | |
| 5,464,658 A | 11/1995 | Yuhas et al. | |
| 5,670,250 A * | 9/1997 | Sanville et al. | 428/323 |
| 5,800,874 A * | 9/1998 | Appelt et al. | 427/412 |
| 5,837,624 A * | 11/1998 | Sakaguchi et al. | 442/208 |
| 5,888,627 A * | 3/1999 | Nakatani | 428/209 |
| 5,916,683 A | 6/1999 | Ueda et al. | |
| 5,965,245 A * | 10/1999 | Okano et al. | 428/209 |
| 6,042,936 A * | 3/2000 | Kempf | 428/323 |
| 6,569,513 B2 * | 5/2003 | Yamaji et al. | 428/209 |

FOREIGN PATENT DOCUMENTS

JP 11077892 * 3/1990

OTHER PUBLICATIONS

Jack Lin, "High Tg and Low Dk Laminate for Next Generation Printed Wiring Board," Technical bulletin of Nan Ya Plastics Corporation, downloaded on Jul. 16, 2009 at http://www.npc.com.tw/emd-new/di1/share/c4-01-1.htm.

* cited by examiner

*Primary Examiner* — Cathy Lam
(74) *Attorney, Agent, or Firm* — Kam W. Law

(57) ABSTRACT

Provided herein are, among other things, epoxy resin varnishes and methods of making and using the same. In some embodiments, the epoxy resin varnishes comprise at least a filler such as silica. In certain embodiments, the epoxy resin varnishes provided herein are used for making laminates such as copper clad laminates. In further embodiments, the copper clad laminates provided herein are used for making printed circuit boards (PCBs).

15 Claims, 8 Drawing Sheets

Open / Flatten

Type of glass fabric

COPPER CLAD LAMINATE, PREPREG AND METHOD OF REDUCING SIGNAL LOSS

PRIOR RELATED APPLICATIONS

This application claims the benefit under 35 U.S.C. §119(a)-(d) of Chinese Patent Application Serial Number 200910115032.5, filed Mar. 24, 2009, which is incorporated herein by reference in its entirety.

FIELD OF THE INVENTION

Provided herein are, among other things, prepregs, copper clad laminates (CCL), printed circuit board (PCB) and methods of making and using the same. In some embodiments, provided herein is a prepreg comprising a partially cured epoxy resin composition and one or more glass fabrics or glass fiber clothes embedded in the partially cured epoxy resin composition, wherein the one or more glass fabrics are opened or flattened before embedded in the partially cured epoxy resin.

BACKGROUND OF THE INVENTION

The electronics industry, being one of the high-technology industries, has been developing rapidly over the past 20 years. Along with the advancement of the modern electronic technology, various tiny and light-weight, high performance, and multi-functional electronic products are being developed. In order to develop electronic products for transmitting high-frequency electric signals and processing information efficiently, one should look for laminates with excellent dielectric properties in order to be compatible with the requirements of high-frequency electromagnetic waves gigahertz frequency (GHz) or megahertz frequency (MHz).

Laminates for high-frequency circuits are heated up and thus energy is dissipated. This leads to the decline of the completeness of high-frequency electric signals. The signal loss is influenced by various factors, mainly because of the epoxy resin forming the laminates and the properties of the glass fabrics. Glass fabrics provide the reinforcement for laminates, the dielectric constants of glass fabrics are higher than the dielectric constants of epoxy resins. Glass fabrics also have very high volume percentage. Further, glass fabrics are highly influential to the signal transmission velocity, transmission path and completeness of signals. Therefore, an in-depth investigation and research of glass fabrics are essential for selecting the suitable materials for making the laminates to cope with the fabrication technology, target properties and costs.

Generally, the reinforcements used for laminates are E glass clothes. E glass clothes have a relatively higher dielectric constant (typically 6.5). If glass clothes with low dielectric constants are used to prepare the reinforcements, e.g., quartz glass clothes (dielectric constant 3.8) and D glass clothes (dielectric constant 4.7), the dielectric constant of the laminates will be significantly lowered. However, due to the higher prices of these glass fabrics, as well as the difficulty of drilling holes, their application as the reinforcements are limited. The air permeability of normal glass fabrics is high and their yarn is wide. Not only do these properties lower the wettability of glass fabrics, they also increase the inconsistency of the substrates for carrying the signal transmission pathway.

Therefore, there is a need for metal clad laminates with lower signal loss. There is also a need for metal clad laminates with improved signal integrity and lower costs.

SUMMARY OF THE INVENTION

Figure 1:
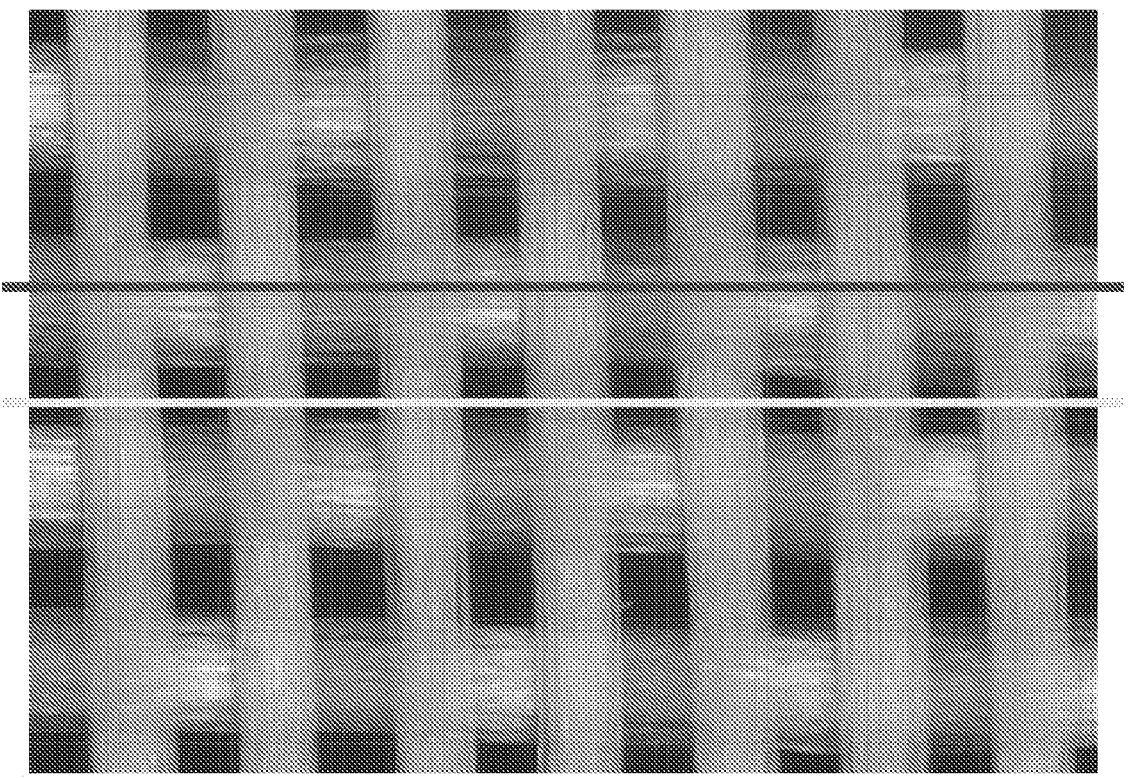
FIG. 1 illustrates an elevation view of one embodiment of a normal glass fiber cloth.

Provided herein are epoxy resin varnishes and methods of making the epoxy resin varnishes. Also provided herein are methods of using the epoxy resin varnishes disclosed herein for making prepregs, metal clad laminates and PCBs.

In one aspect, provided herein is a prepreg comprising a partially cured epoxy resin composition and one or more glass fabrics embedded in the partially cured epoxy resin composition, wherein the one or more glass fabrics are opened or flattened before embedded in the partially cured epoxy resin.

In some embodiments, the air permeability of the one or more glass fabrics disclosed herein is less than about 90 cc/cm$^2$/sec. In other embodiments, the air permeability of the one or more glass fabrics disclosed herein is from about 15 cc/cm$^2$/sec to about 50 cc/cm$^2$/sec. In further embodiments, the air permeability of the one or more glass fabrics disclosed herein meets the JIS L 1096 specification.

In certain embodiments, the thickness of the one or more glass fabrics disclosed herein is from about 30 μm to about 60 μm. In other embodiments, the thickness of the one or more glass fabrics disclosed herein is from about 45 μm to about 55 μm. In further embodiments, the width of the warp yarn of the one or more glass fabrics disclosed herein is from about 0.235 mm to about 0.265 mm and the width of the weft yarn of the one or more glass fabrics disclosed herein is from about 0.295 mm to about 0.325 mm.

In some embodiments, the epoxy resin composition disclosed herein comprises an epoxy resin, a curing agent, a coupling agent, a catalyst, and an inorganic filler. In other embodiments, the inorganic filler disclosed herein is talc, silica, aluminum hydroxide, mica, kaolin, aluminum silicate, clay or a combination thereof. In further embodiments, the amount of the inorganic filler disclosed herein is from about 5 parts to about 30 parts by weight, based on 100 parts by weight of the epoxy resin disclosed herein.

In certain embodiments, the inorganic filler disclosed herein is a silica having an average particle size from about 0.05 microns to about 20 microns, wherein the amount of the silica disclosed herein is from about 12.5 parts to about 20 parts by weight, based on 100 parts by weight of the epoxy resin disclosed herein.

In another aspect, provided herein is a metal clad laminate comprising
  a) an insulating layer; and
  b) a metal layer on at least one surface of the insulating layer;
wherein the insulating layer comprising a cured epoxy resin composition and one or more glass fabrics embedded in the cured epoxy resin composition, and wherein the one or more glass fabrics are opened or flattened before embedded in the cured epoxy resin.

In some embodiments, the metal of the metal clad laminate disclosed herein is copper.

In other embodiments, the metal clad laminate disclosed herein is a double-sided copper clad laminate having a copper layer on each of the two main surfaces of the resin layer.

In one aspect, provided herein is a method of preparing a prepreg comprising:
  (a) opening or flattening one or more glass fabrics;
  (b) impregnating the one or more glass fabrics with an epoxy resin varnish; and
  (c) drying the impregnated one or more glass fabrics at a temperature from about 100° C. to about 250° C.

In another aspect, provided herein is a method of preparing a metal clad laminate comprising:
  (a) opening or flattening one or more glass fabrics;
  (b) impregnating the one or more glass fabrics with an epoxy resin varnish;
  (c) drying the impregnated one or more glass fabrics at a temperature from about 100° C. to about 250° C. to form a prepreg; and
  (d) contacting a metal foil with at least a surface of the prepreg; and thermopress-bonding the metal foil to the surface of the prepreg.

DEFINITIONS

In the following description, all numbers disclosed herein are approximate values, regardless whether the word "about" or "approximate" is used in connection therewith. They may vary by 1 percent, 2 percent, 5 percent, or, sometimes, 10 to 20 percent. Whenever a numerical range with a lower limit, $R^L$, and an upper limit, $R^U$, is disclosed, any number falling within the range is specifically disclosed. In particular, the following numbers within the range are specifically disclosed: $R=R^L+k*(R^U-R^L)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed.

DESCRIPTION OF EMBODIMENTS OF THE INVENTION

Provided herein is a prepreg comprising a partially cured epoxy resin composition and one or more glass fabrics embedded in the partially cured epoxy resin composition, wherein the one or more glass fabrics are opened or flattened before embedded in the partially cured epoxy resin.

In certain embodiments, the epoxy resin composition disclosed herein comprises an epoxy resin. In some embodiments, the epoxy resin composition disclosed herein is partially cured. In other embodiments, the cured epoxy resin composition disclosed herein is fully cured. In further embodiments, the cured epoxy resin composition disclosed herein is partially or fully cured. In general, curing is a chemical reaction in which the epoxide groups in epoxy resins react with a curing agent or a hardener to form a highly crosslinked, three-dimensional network. Generally, the aim of curing the resins with the curing agent is to convert the epoxy resins into a hard, infusible and rigid material. Epoxy resins can generally be cured at temperatures from about 5° C. to about 150° C., depending on the type of the curing agent.

In some embodiments, the prepreg disclosed herein comprises a reinforcement. In other embodiments, the prepreg disclosed herein comprises a reinforcement embedded in the partially cured epoxy resin composition. Any reinforcement suitable for preparing prepreg can be used herein. In other embodiments, the reinforcement is woven or nonwoven clothes of organic or glass fibers. In further embodiments, the reinforcement comprises one or more glass fabrics. In general, glass fabrics consist of bulk, chopped fibers or continuous strands of glass, commonly used in reinforcing plastics and composites as well as other specialized electrical and thermal applications. The glass fiber generally used to create the glass fabrics is made by extruding very thin strands of silica-based monofilament. In general, glass is an amorphous solid that behaves like a viscous liquid. Further, clothes made of glass fibers generally have high tensile strength, dimensional stability, high heat and fire resistance. In certain embodiments, the one or more glass fabrics are epoxy glass fabrics.

In certain embodiments, the reinforcement disclosed herein is an E-glass cloth in 16.3 g, 48 g, 210 g or 258 g fiber weights. In other embodiments, the reinforcement is an NE-type glass cloth. The NE-type glass cloth is a glass cloth having a low dielectric constant. In general, NE-glass cloths have a lower dielectric constant than those of the ordinary E-glass clothes. In further embodiments, the reinforcement is a quartz glass cloth. In some embodiments, the reinforcement is a D glass cloth. Some non-limiting examples of suitable reinforcements are described in Merrill L. Minges, *"Electronic Materials Handbook"*, ASM International Handbook Committee, Materials Park, Ohio, 1989, which is incorporated herein by reference.

In general, normal glass fabrics have low wettability due to their high air permeability and wide yarn. Normal glass fabrics generally have high heterogeneity of the substrates for the signal transmission pathway. FIG. 1 illustrates an elevation view of one embodiment of a normal glass fiber cloth. As shown in FIG. 1, a signal transmission pathway 1 passes through the normal glass fiber cloth, while a signal transmission pathway 2 passes through the resins. The width of yarn is described in Horrocks et al., *"Handbook of technical textiles, Woodhead Publishing in Textile Technology Series"*, Woodhead Publishing Limited, Cambridge, UK, 2000, which is incorporated herein by reference.

In some embodiments, the one or more glass fabrics disclosed herein are opened before embedded in the partially cured epoxy resin. In other embodiments, the one or more glass fabrics disclosed herein are flattened before embedded in the partially cured epoxy resin. In further embodiments, the one or more glass fabrics disclosed herein are opened or flattened before embedded in the partially cured epoxy resin. Generally, an opened glass fiber cloth is a glass fiber cloth made by physically reprocessing a ready-to-use normal glass fiber cloth. The opened glass fiber cloth can be generally prepared by spraying high pressure water jet to reprocess the glass fiber cloth after the weaving of the glass fiber cloth has been finished. In some embodiments, a steel plate having some micro holes is used and the high pressure water is sprayed through the holes to reprocess the glass fiber cloth.

In certain embodiments, the warp and weft yarn on the surface of the opened glass fabrics disclosed herein are smooth. In other embodiments, the overlapping parts of the warp and weft yarn of the opened glass fabrics are less bulged, compared to the overlapping parts of the warp and weft yarn of normal glass fabrics. In further embodiments, fewer gaps exist between the warp and weft yarn of the opened glass fabrics disclosed herein, compared to normal glass fabrics. In some embodiments, the smoothness of the opened glass fabrics disclosed herein is higher than the smoothness of normal glass fabrics.

Generally, signal transmission velocity is the velocity at which a signal is communicated between two separated parties. Signal transmission velocities is directly proportional to the velocity of light; and inversely proportional to the square root of dielectric constant of the signal transmission medium. Due to the different dielectric constants of glass fabrics and resin matrix, there are different signal transmission velocities when signals are transmitted in glass fabrics and resin matrix. Therefore, the difference in the signal transmission velocities lead to various consequences including delay, crosstalk, offset and electromagnetic interference during signal transmission, resulting in the signal loss of the system.

Figure 2:
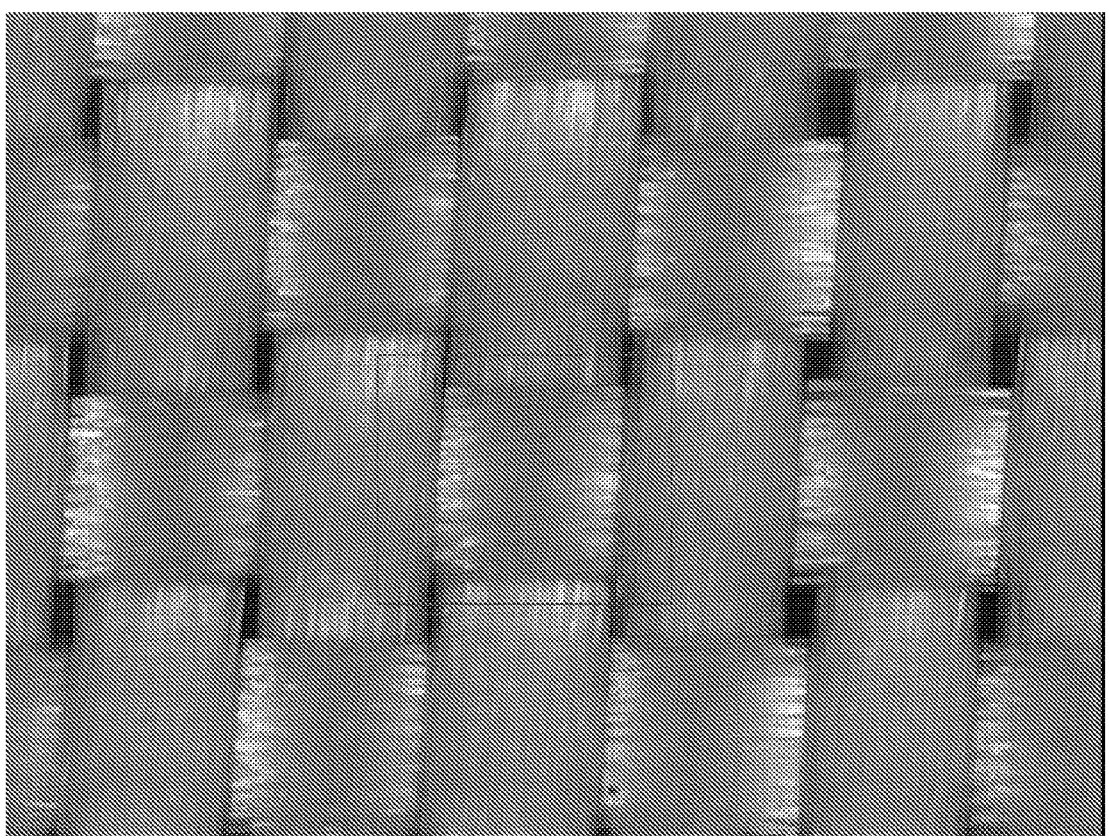
FIG. 2 illustrates an elevation view of one embodiment of a glass fiber cloth 7628.

In some embodiments, the reinforcement disclosed herein is the one or more glass fabrics with higher warp densities. In other embodiments, the glass fiber cloth with higher warp densities is a normal glass fiber cloth 7628. FIG. 2 illustrates an elevation view of one embodiment of a glass fiber cloth 7628. The nodes of the normal glass fiber cloth 7628 are illustrated in FIG. 2. In further embodiments, the wettability of normal glass fiber cloth at the nodes are low. In still further embodiments, when high-frequency electronic signals are transmitted via a normal glass fiber cloth, the signal loss is low.

Figure 3:
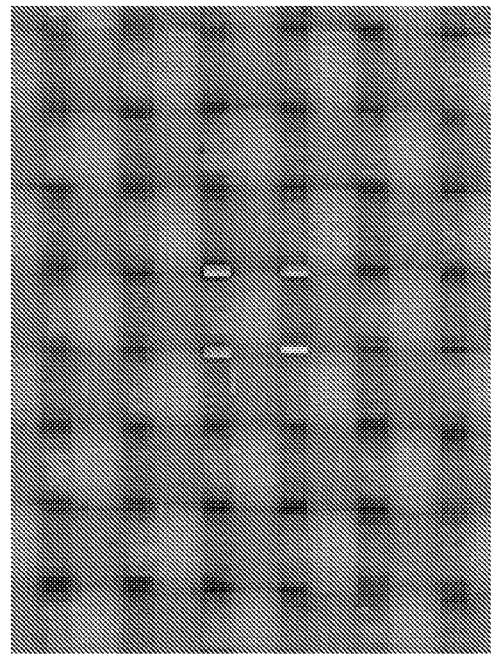
FIG. 3 illustrates an elevation view of one embodiment of a glass fiber cloth, before and after being opened or flattened.
Figure 3:
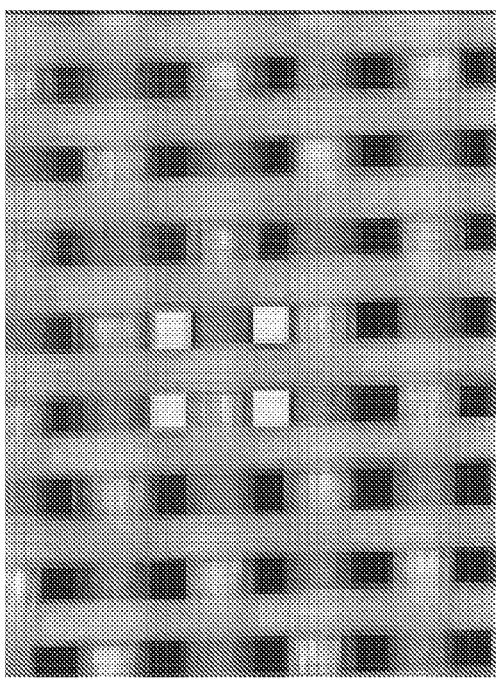

FIG. 3 illustrates an elevation view of one embodiment of a glass fiber cloth, before and after being opened or flattened. As shown in FIG. 3, the glass fiber cloth after being opened or flattened have smaller gaps, wider yarn, smoother intersection. In some embodiments, an opened or flattened glass fiber cloth has a lower air permeability, compared to a normal glass fiber cloth.

In some embodiments, the air permeability of the one or more glass fabrics disclosed herein is less than about 90 $cc/cm^2/sec$. In other embodiments, the air permeability of the one or more glass fabrics is from about 15 $cc/cm^2/sec$ to about 50 $cc/cm^2/sec$. Generally, air permeability of a glass fiber cloth is the degree to which the glass fiber cloth allows air to pass through its construction. In further embodiments, the air permeability of the one or more glass fabrics disclosed herein is less than about 10 $cc/cm^2/sec$, less than about 20 $cc/cm^2/$ sec, less than about 30 $cc/cm^2/sec$, less than about 40 $cc/cm^2/$ sec, less than about 50 $cc/cm^2/sec$, less than about 60 $cc/cm^2/$ sec, less than about 70 $cc/cm^2/sec$, less than about 75 $cc/cm^2/$ sec, less than about 80 $cc/cm^2/sec$, less than about 85 $cc/cm^2/$ sec, less than about 90 $cc/cm^2/sec$, less than about 95 $cc/cm^2/$ sec, less than about 10 $cc/cm^2/sec$, less than about 10 $cc/cm^2/$ sec, less than about 10 $cc/cm^2/sec$, less than about 100 $cc/cm^2/sec$, less than about 105 $cc/cm^2/sec$, less than about 110 $cc/cm^2/sec$, less than about 120 $cc/cm^2/sec$, less than about 125 $cc/cm^2/sec$, or less than about 130 $cc/cm^2/sec$ or less than about 135 $cc/cm^2/sec$.

In further embodiments, the air permeability of the one or more glass fabrics is from about 5 $cc/cm^2/sec$ to about 200 $cc/cm^2/sec$, from about 8 $cc/cm^2/sec$ to about 180 $cc/cm^2/sec$, from about 5 $cc/cm^2/sec$ to about 150 $cc/cm^2/sec$, from about 10 $cc/cm^2/sec$ to about 140 $cc/cm^2/sec$, from about 5 $cc/cm^2/$ sec to about 40 $cc/cm^2/sec$, from about 10 $cc/cm^2/sec$ to about 60 $cc/cm^2/sec$, from about 12 $cc/cm^2/sec$ to about 60 $cc/cm^2/$ sec, from about 15 $cc/cm^2/sec$ to about 50 $cc/cm^2/sec$, from about 18 $cc/cm^2/sec$ to about 70 $cc/cm^2/sec$, from about 20 $cc/cm^2/sec$ to about 90 $cc/cm^2/sec$, from about 25 $cc/cm^2/sec$ to about 85 $cc/cm^2/sec$, from about 30 $cc/cm^2/sec$ to about 90 $cc/cm^2/sec$, from about 35 $cc/cm^2/sec$ to about 65 $cc/cm^2/sec$, from about 40 $cc/cm^2/sec$ to about 70 $cc/cm^2/sec$, from about 45 $cc/cm^2/sec$ to about 85 $cc/cm^2/sec$, from about 50 $cc/cm^2/$ sec to about 100 $cc/cm^2/sec$, or from about 55 $cc/cm^2/sec$ to about 150 $cc/cm^2/sec$.

In certain embodiments, the air permeability of the one or more glass fabrics disclosed herein is more than about 10 $cc/cm^2/sec$, more than about 20 $cc/cm^2/sec$, more than about 30 $cc/cm^2/sec$, more than about 40 $cc/cm^2/sec$, more than about 50 $cc/cm^2/sec$, more than about 60 $cc/cm^2/sec$, more than about 70 $cc/cm^2/sec$, more than about 75 $cc/cm^2/sec$, more than about 80 $cc/cm^2/sec$, more than about 85 $cc/cm^2/$ sec, more than about 90 $cc/cm^2/sec$, more than about 95 $cc/cm^2/sec$, more than about 10 $cc/cm^2/sec$, more than about 10 $cc/cm^2/sec$, more than about 10 $cc/cm^2/sec$, more than about 100 $cc/cm^2/sec$, more than about 105 $cc/cm^2/sec$, more than about 110 $cc/cm^2/sec$, more than about 120 $cc/cm^2/sec$, more than about 125 $cc/cm^2/sec$, or more than about 130 $cc/cm^2/sec$ or more than about 135 $cc/cm^2/sec$.

In certain embodiments, the air permeability of the one or more glass fabrics disclosed herein meets the JIS L 1096 specification, which is incorporated herein by reference. Alternatively, the air permeability of the one or more glass fabrics cam be tested by the Air Permeability Test disclosed herein.

Figure 7:
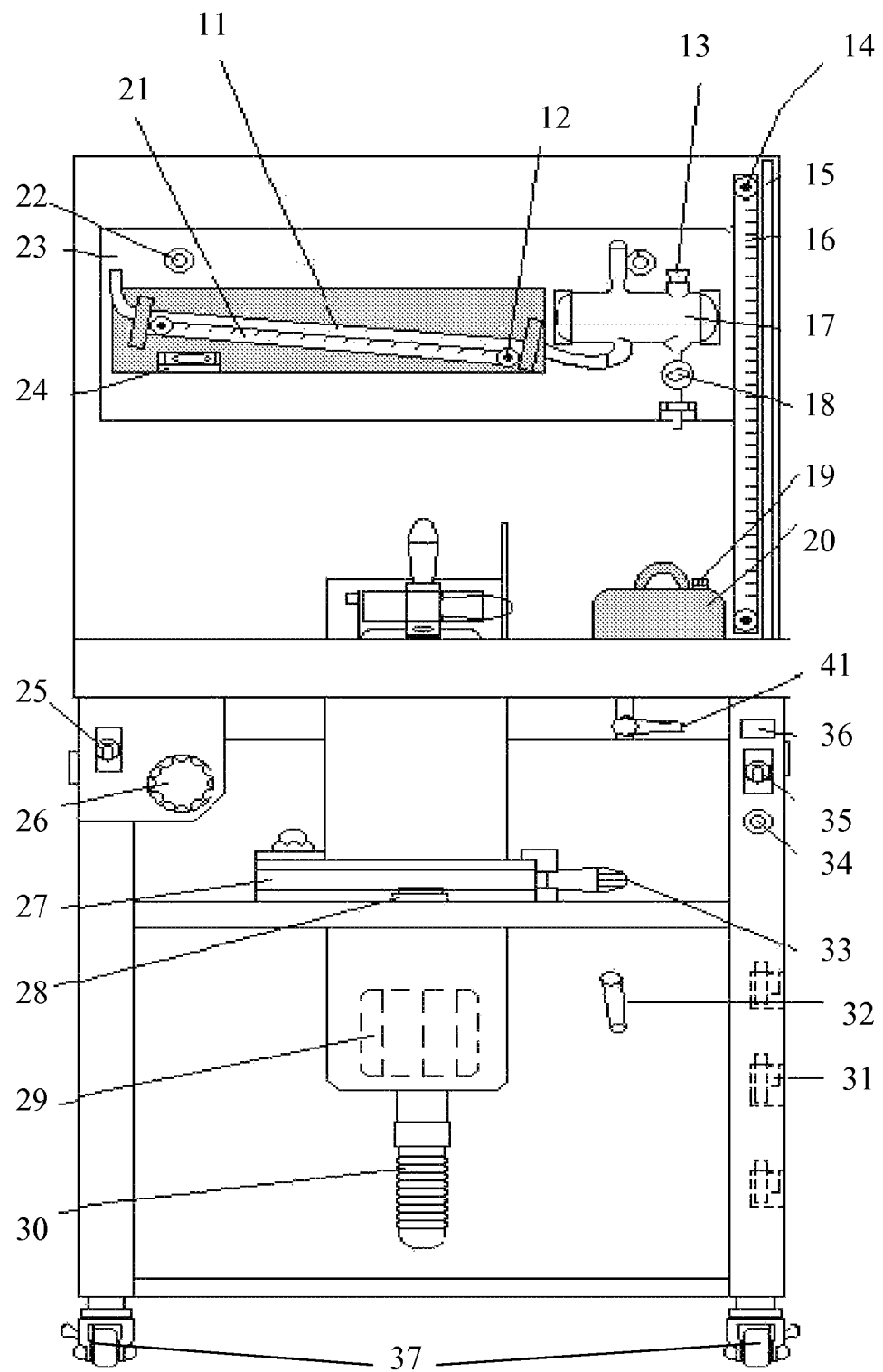
FIG. 7 illustrates a front view of a Frazile Type Textile Air Permeability Tester (Model: AP-360) ("Textile Air Permeability Tester").

FIG. 7 illustrates a front view of one embodiment of the Textile Air Permeability Tester. As shown in FIG. 7, a power switch 35 is for switching on/off the Textile Air Permeability Tester. When a power 36 lights up, the Textile Air Permeability Tester has been switched on. Alternatively, when a power 36 lights off, the Textile Air Permeability Tester has been switched off. A fuse 34 is installed in the Textile Air Permeability Tester for safety. A specimen of glass fabrics can be placed on the top of an opening 38. An orifice 28, which is stored on an orifice rack 31, can be used to test the air permeability of a specimen. A specimen can be put on the top of an opening 38, which is connected to a cylinder 39. The cylinder 39 is partitioned into two chambers by the orifice 28. The upper chamber of the cylinder 39 is Chamber A. The lower chamber of the cylinder 39 is Chamber B, wherein Chamber B comprises a rectifier 29 and a tube 30. In order to set the orifice 28 in place, a handle 33 is pulled away from a back 37 so as to pull out a orifice setting plate 27. A plurality of wheels 37 on the bottom of the Textile Air Permeability Tester allows movement of the Textile Air Permeability Tester.

FIG. 7 illustrates one embodiment of the Textile Air Permeability Tester, wherein the Textile Air Permeability Tester comprises an inclined water manometer 11 and a vertical water manometer 15. The readings of the inclined water manometer 11 and the vertical water manometer 15 can be read from an inclined water manometer meter 21 and a vertical water manometer meter 16 respectively. The inclination of the inclined water manometer 11 can be adjusted by an inclination board. A level 24 beneath the inclined water manometer 11 indicates the horizontal level. A water reservoir (inclined water manometer) 17 is connected to the inclined water manometer 11 for holding water. The water reservoir (inclined water manometer) 17 is closed by a rubber plug 13. The outlet of the water reservoir (inclined water manometer) 17 is controlled by a water outlet screw 18. A water reservoir (vertical water manometer) 20 is connected to the vertical water manometer 15 for holding water. Water can be entered into the water reservoir (vertical water manometer) 20 via a water inlet 19.

Adjustment of the inclined water manometer 11 and the vertical water manometer 15 can be performed by adjusting the volume of water in the water reservoir (inclined water manometer) 17 and the water reservoir (vertical water manometer) 20 respectively. The volume of water in the water reservoir (inclined water manometer) 17 can be adjusted by an inclined water manometer knob 22. Fine adjustment of the inclined water manometer 11 can be performed by sliding the inclined water manometer meter 21. By swirling an inclined water manometer meter knob 12, the inclined water manometer meter 21 can be parallel to the inclined water manometer 11. The volume of water in the water reservoir (vertical water manometer) 20 can be adjusted by a vertical water manometer knob 14. A valve (vertical water manometer) 41 can be adjusted to allow the outlet of water from the water reservoir (vertical water manometer) 20. When the valve (vertical water manometer) 41 was opened, water flows out of the water reservoir (vertical water manometer) 20 via a tube (vertical water manometer) 32. Air can be introduced into the inclined water manometer 11 by switching on a electric switch and swirling a rheostat 26.

Figure 8:
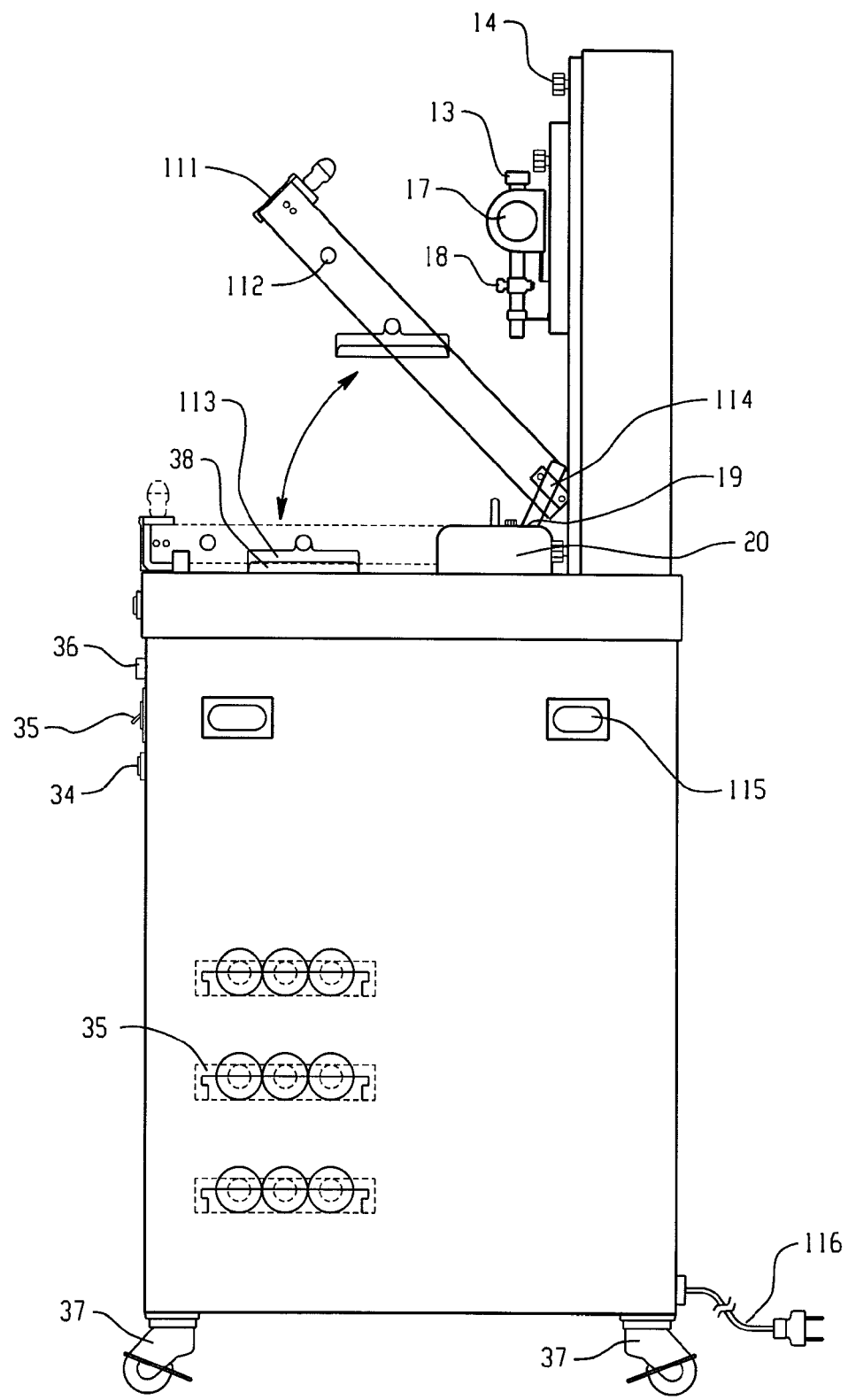
FIG. 8 illustrates a side view of one embodiment of the Textile Air Permeability Tester.

FIG. 8 illustrates a side view of one embodiment of the Textile Air Permeability Tester. A sample setting ring 113 can be used to set an appropriate tension on the specimen. The specimen can be fixed at an appropriate position by lowering a stand 115. The specimen can then be locked by a lock 111. When the stand 115 is at an inclined position, a stand lock 115 can be opened by pushing the stand 115 towards the back 37. A stand handle 112 is for moving the stand 115.

A water reservoir (inclined water manometer) 17 is connected to the inclined water manometer 11 for holding water. The water reservoir (inclined water manometer) 17 is closed by a rubber plug 13. The outlet of the water reservoir (inclined water manometer) 17 is controlled by a water outlet screw 18. A water reservoir (vertical water manometer) 20 is connected to the vertical water manometer 15 for holding water. Water can be entered into the water reservoir (vertical water manometer) 20 via a water inlet 19. As shown in FIG. 8, the power switch 35 is for switching on/off the Textile Air Permeability Tester. The Textile Air Permeability Tester can be connected to a power source (not shown in FIG. 8) by an electrical wire 116. Any power source known to the skilled artisan can be used herein. In some embodiments, the power source disclosed herein is an A/C 220V/50 Hz power source. When the power 36 lights up, the Textile Air Permeability Tester has been switched on. Alternatively, when the power 36 lights off, the Textile Air Permeability Tester has been switched off. The fuse 34 is installed in the Textile Air Permeability Tester for safety. FIG. 8 illustrates the side view of one embodiment of the Textile Air Permeability Tester, wherein the Textile Air Permeability Tester comprises an orifice rack 31.

In certain embodiments, the air permeability difference of the one or more glass fabrics disclosed herein meets the JIS L 1018 specification, which is incorporated herein by reference. Alternatively, the air permeability difference of the one or more glass fabrics cam be tested by the following procedures. After a specimen of the one or more glass fabrics disclosed herein were immersed in water for about 24 hours, the one or more glass fabrics were then dried for about 3 minutes, the specimen air-dried in an atmosphere of about 20° C. and about 65% for about 24 hours was measured for a weight W0 (g) and air permeability as a dried sample. After the specimen was immersed in water for 24 hours, the sample was dried. Afterwards, the specimen was measured for a weight W (g) and air permeability every 30 minutes in an atmosphere of about 20° C. and about 65%. The air permeability difference of the specimen was calculated by the difference between the air permeability of the specimen in the dry state and the air permeability of the specimen in about 60% of water content. The air permeability can be measured by the Textile Air Permeability Tester disclosed herein.

In some embodiments, the thickness of the one or more glass fabrics is from about 30 µm to about 60 µm. In other embodiments, the thickness of the one or more glass fabrics is from about 45 µm to about 55 µm. Any known method of measuring the thickness of glass fabrics can be used herein to measure the thickness of glass fabrics. For example, the measurement of the thickness of fabrics is described in R. P. Donovan, "Fabric filtration for combustion sources: fundamentals and basic technology", CRC Press, Boca Raton, Fla. 1985, which is incorporated herein by reference. One non-limiting example of a suitable method for measuring the thickness of fabrics is the Fabric Assurance by Simple Testing system ("FAST"), developed by Commonwealth Scientific and Industrial Research Organisation, which is described in Pier Giorgio Minazio, "FAST—Fabric Assurance by Simple Testing", International Journal of Clothing Science and Technology, Vol. 7, Issue 2/3, p. 43-48, 1995. Generally, the FAST system consists a test method for measuring the thickness of fabrics with micrometer resolution. One non-limiting example of suitable method for measuring the thickness of fabrics is described in Kang et al., "Automatic Structure Analysis and Objective Evaluation of Woven Fabric Using Image Analysis", Textile Research Journal, Vol. 71, No. 3, p. 261-270 (2001), which is incorporated herein by reference. The method described in Kang et al. is an automatic fabric evaluation system, equipped with a charge-coupled device camera. Images of specimens are processed by Gaussian filtering and histogram equalization. The method described in Kang et al. evaluates fabric construction parameters including count, cloth cover, yarn crimp, fabric thickness and weight per unit area.

In certain embodiments, the thickness of the one or more glass fabrics is from about 1 µm to about 100 µm, from about 10 µm to about 100 µm, from about 20 µm to about 100 µm, from about 30 µm to about 100 µm, from about 40 µm to about 100 µm, from about 40 µm to about 90 µm, from about 40 µm to about 80 µm, from about 40 µm to about 70 µm, from about 50 µm to about 70 µm, from about 30 µm to about 60 µm, from about 20 µm to about 50 µm, from about 10 µm to about 60 µm, from about 10 µm to about 40 µm or from about 10 µm to about 30 µm.

In further embodiments, the thickness of the one or more glass fabrics is from about 5 µm to about 105 µm, from about 15 μm to about 95 μm, from about 25 μm to about 85 μm, from about 35 μm to about 75 μm, from about 25 μm to about 35 μm, from about 35 μm to about 45 μm, from about 45 μm to about 55 μm, from about 55 μm to about 65 μm, from about 65 μm to about 75 μm, from about 75 μm to about 85 μm, from about 85 μm to about 95 μm, from about 95 μm to about 105 μm or from about 35 μm to about 105 μm, from about 45 μm to about 95 μm, from about 55 μm to about 85 μm or from about 65 μm to about 75 μm.

In some embodiments, the width of the warp yarn of the one or more glass fabrics is from about 0.235 mm to about 0.265 mm and the width of the weft yarn of the one or more glass fabrics is from about 0.295 mm to about 0.325 mm. Any known method of measuring the width of the warp and weft yarn can be used herein to measure the width of the warp and weft yarn of glass fabrics. One non-limiting example of a suitable method for measuring the width of the warp and weft yarn is described in Xu et al., *"Automatic Measurement and Recognition of Yarn Snarls by Digital Image and Signal Processing Methods"*, Textile Research Journal, Vol. 78, No. 5, p. 439-456 (2008), which is incorporated herein by reference. The measurement of the width of the warp and weft yarn begins with image acquisition, image conversion of specimens of yarn. Then, the yarn profile function can be extracted from the separated binary image. A pattern recognition algorithm is then performed by the Fast Fourier Transform and Adaptive Orientated Orthogonal Projective Decomposition by treating the yarn profile function as a one-dimensional signal.

In some embodiments, the width of the warp yarn of the one or more glass fabrics is from about 0.005 mm to about 0.500 mm, from about 0.015 mm to about 0.400 mm, from about 0.025 mm to about 0.300 mm, from about 0.050 mm to about 0.200 mm, from about 0.150 mm to about 0.300 mm, from about 0.200 mm to about 0.450 mm, from about 0.235 mm to about 0.265 mm, from about 0.235 mm to about 0.500 mm, from about 0.265 mm to about 0.250 mm, from about 0.265 mm to about 0.300 mm or from about 0.300 mm to about 0.500 mm.

In certain embodiments, the width of the weft yarn of the one or more glass fabrics is from about 0.295 mm to about 0.325 mm. In other embodiments, the width of the weft yarn of the one or more glass fabrics is from about 0.005 mm to about 0.800 mm, from about 0.005 mm to about 0.500 mm, from about 0.015 mm to about 0.450 mm, from about 0.025 mm to about 0.400 mm, from about 0.050 mm to about 0.300 mm, from about 0.100 mm to about 0.300 mm, from about 0.250 mm to about 0.450 mm, from about 0.295 mm to about 0.325 mm, from about 0.295 mm to about 0.350 mm, from about 0.295 mm to about 0.400 mm, from about 0.295 mm to about 0.450 mm, from about 0.295 mm to about 0.500 mm or from about 0.295 mm to about 0.800 mm.

In further embodiments, the elongation rate under tension of the reinforcement disclosed herein meets the JIS R 3420 specification, which is incorporated herein by reference. In still further embodiments, the elongation rate under tension of the one or more glass fabrics disclosed herein meets the JIS R 3420 specification.

In some embodiments, the epoxy resin composition disclosed herein comprises an epoxy resin, a curing agent, a coupling agent, a catalyst, and an inorganic filler. In general, an epoxy resin is defined as a molecule containing more than one epoxide groups. Epoxy resins are generally thermosetting polymers being used as adhesives, high performance coatings and potting and encapsulating materials. Epoxy resins generally have good electrical properties, low shrinkage, good adhesion to metals and resistance to moisture, thermal and mechanical shock. Epoxy resins are generally characterized by viscosity, epoxide equivalent weight and molecular weight. Any epoxy resin that can be cured, polymerized or crosslinked when mixed with an epoxy curing agent or hardener can be used herein. In general, epoxy resins are classified into glycidyl epoxy and non-glycidyl epoxy resins. Glycidyl epoxies are generally classified into glycidyl-ether, glycidyl-ester and glycidyl-amine. Non-glycidyl are generally classified into aliphatic and cycloaliphatic epoxy resins. In general, glycidyl epoxies are formed by a condensation reaction between epichlorohydrin and either a dihydroxy compound, a dibasic acid or a diamine. Non-glycidyl epoxies are generally formed by peroxidation of olefinic double bond.

In some embodiments, the epoxy resins are produced from a reaction between a halogen-containing epoxide such as epichlorohydrin and an aromatic diol. Some non-limiting examples of suitable halogen-containing epoxides include 1-chloro-2,3-epoxypropane (epichlorohydrin), 3-chloro-1,2-epoxybutane, 3-bromo-1,2-epoxybutane, 3-chloro-1,2-epoxyoctane and the like. Some non-limiting examples of suitable aromatic diols include 4,4'-dihydroxy-2,2-diphenylpropane (bisphenol A), bis(4-hydroxyphenyl)methane (bisphenol F), brominated bisphenol A, 4,4'-sulfonyldiphenol (bisphenol S), bisphenol AF ($(CF_3)_2C(C_6H_4OH)_2$), 2,2-bis(4-hydroxyphenyl)-butane, 4,4'-dihydroxy-benzophenone, bis(4-hydroxyphenyl)-ethane, 2,2-bis(4-hydroxyphenyl)-pentane, 1,5-dihydroxynaphthalene, 4,4'-biphenol, catechol, resorcinol, hydroquinone, novolacs, and hydrogenated derivatives thereof.

In some embodiments, the epoxy resin is derived from a reaction between epichlorohydrin and bisphenol A, bisphenol F, brominated bisphenol A, bisphenol S, bisphenol AF, 4,4'-biphenol, catechol, resorcinol, hydroquinone or a combination thereof. In other embodiments, the epoxy resin is not derived from bisphenol A, bisphenol F, brominated bisphenol A, bisphenol S, bisphenol AF, or 4,4'-biphenol.

In certain embodiments, the epoxy resin disclosed herein is derived from a reaction between epichlorohydrin and brominated bisphenol A. In some embodiments, the epoxy resin comprises one or more diepoxy compounds having formula (I):

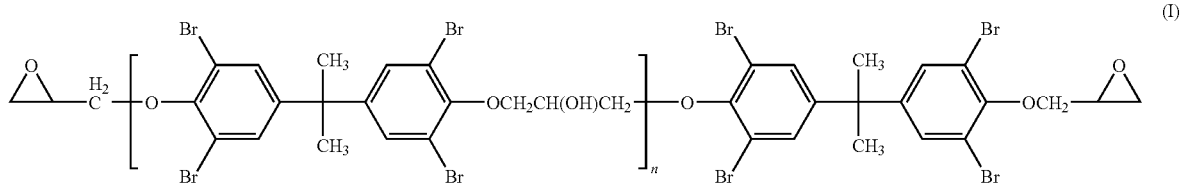

where n is an integer from 0 to about 100, from 0 to about 50, from 0 to about 25, from 0 to about 20, from 0 to about 10, from 0 to about 5, from 0 to about 4, from 0 to about 3, from 0 to about 2, or from 0 to about 1. In further embodiments, n is 0, 1, 2, 3, 4, 5, 6, 7, 8, 9 or 10. In still further embodiments, n is 0 and the diepoxy compound has formula (IA) as shown below:

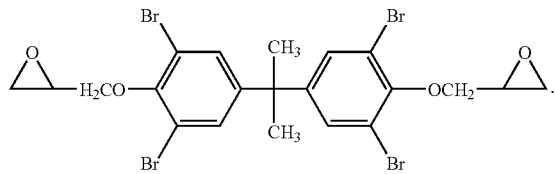

(IA)

In some embodiments, the epoxy resin disclosed herein is a diglycidyl ether of bisphenol-A (DGEBA). The epoxy resin disclosed herein is derived from a reaction between epichlorohydrin and bisphenol A. In other embodiments, the epoxy resin disclosed herein is derived from a reaction between epichlorohydrin and bisphenol A in the presence of a basic catalyst. In further embodiments, the epoxy resin comprises one or more diepoxy compounds having formula (II):

(II)

where n is an integer from 0 to about 100, from 0 to about 50, from 0 to about 25, from 0 to about 20, from 0 to about 10, from 0 to about 5, from 0 to about 4, from 0 to about 3, from 0 to about 2, or from 0 to about 1. In still further embodiments, n is 0, 1, 2, 3, 4, 5, 6, 7, 8, 9 or 10. In still further embodiments, n is 0 and the diepoxy compound has formula (IIA) as shown below:

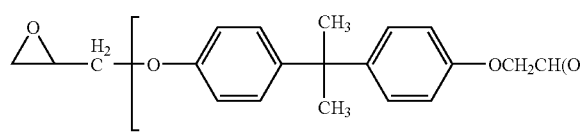

(IIA)

In some embodiments, the epoxy resin is a bisphenol A epoxy resin, a tetrabromobisphenol A type epoxy resin, a multi-functional epoxy resin, a novolac epoxy resin, a halogen-free epoxy resin or the like. In certain embodiments, the epoxy resin is a novolac epoxy resin. In other embodiments, the epoxy resin disclosed herein is derived from a reaction between phenolic novolac resin and epichlorohydrin. In further embodiments, the epoxy resin disclosed herein is derived from a reaction between phenolic novolac resin and epichlorohydrin in the presence of a basic catalyst. In still further embodiments, the basic catalyst disclosed herein is sodium hydroxide. In some embodiments, the phenolic novolac resin is derived from a reaction between phenol and formaldehyde. In other embodiments, the phenolic novolac resin is derived from a reaction between phenol and formaldehyde in the presence of an acidic catalyst. In other embodiments, the novolac epoxy resin disclosed herein has the following formula (III):

(III)

where n is an integer from 0 to about 100, from 0 to about 50, from 0 to about 25, from 0 to about 20, from 0 to about 10, from 0 to about 5, from 0 to about 4, from 0 to about 3, from 0 to about 2, or from 0 to about 1. In still further embodiments, n is 0, 1, 2, 3, 4, 5, 6, 7, 8, 9 or 10. In still further embodiments, n is 0 and the diepoxy compound has formula (IIIA) as shown below:

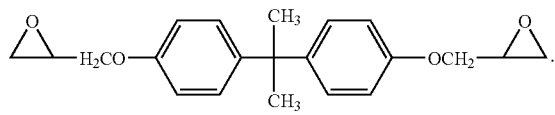

(IIIA)

Optionally, the epoxy resin varnish or epoxy resin composition disclosed herein comprises a curing agent. Any curing agent or hardener than cures epoxy resins can be used herein. In some embodiments, the curing agent or hardener is or comprises a phenolic hardener (e.g., phenolic novolac or resorcinol novolac), an aliphatic or cycloaliphatic amine or polyamine hardener (e.g., diethylenetriamine (DETA), triethylene-tetramine (TETA), tetraethylene-pentamine (TEPA), aminoethylpiperazine (AEP), polyethylene polyamine, polyamine epoxy adduct), an amide or polyamide hardener, dicyandiamide, bis(4,4'-diaminodiphenyl)sulfone (DDS), or a combination thereof. In certain embodiments, the curing agent or hardener is or comprises a phenolic novolac.

The amount of the curing agent can be from about 0.05 parts to about 50 parts, based on 100 parts by weight of the epoxy resin. In some embodiments, the amount of the curing agent is from about 0.1 parts to about 45 parts, from about 1 part to about 40 parts, from about 5 parts to about 35 parts, from about 10 parts to about 35 parts, or from about 15 parts to about 35 parts by weight, based on 100 parts by weight of the epoxy resin. In other embodiments, the amount of the curing agent is from about 1 parts to about 45 parts, from about 5 part to about 40 parts, from about 10 parts to about 30 parts, from about 10 parts to about 25 parts, or from about 10 parts to about 20 parts by weight, based on 100 parts by weight of the epoxy resin. In further embodiments, the amount of the curing agent is from about 15 parts to about 35 parts by weight, based on 100 parts by weight of the epoxy resin. In still further embodiments, the amount of the inorganic filler is from about 12.5 parts to about 20 parts by weight, based on 100 parts by weight of the epoxy resin.

The epoxy resin varnish or epoxy resin composition optionally comprises a coupling agent. Any coupling agent that improves adhesion of the epoxy resins disclosed herein to surfaces of the inorganic filler particles can be used herein. In some embodiments, the coupling agent is or comprises a silane coupling agent, zirconate coupling agent, titanate coupling agent, borane-based coupling agent, aluminum-based coupling agent, chromium-based coupling agent, maleic anhydride coupling agent or a combination thereof. In other embodiments, the epoxy resin varnish or epoxy resin composition disclosed herein does not comprise a coupling agent.

Any silane or titanate coupling agent known to a skilled artisan can be used herein. Some non-limiting examples of suitable silane coupling agents include: triethoxy silane; vinyl tris(β-methoxyethoxy)silane; 3-methacryloxypropyl trimethoxy silane; 3-glycidyloxypropyl trimethoxy silane; 2-(3,4-epoxycyclohexyl)ethyl trimethoxy silane; N-(2-aminoethyl)-3-aminopropyl trimethoxy silane; N-(2-aminoethyl)-3-aminopropyl methyl dimethoxy silane; 3-aminopropyl triethoxy silane; N-phenyl-3-aminopropyl trimethoxy silane; 3-mercaptopropyl trimethoxy silane; 3-chloropropyl trimethoxy silane and the like. Some non-limiting examples of suitable titanate coupling agents include: isopropyl triisostearoyl titanate; isopropyl tridecylbenzene sulfonyl titanate; isopropyl tris(dioctyl pyrophosphato) titanate; tetraisopropyl bis(dioctylphosphito) titanate; tetraoctyl bis(ditridecyl phosphito) titanate; tetra(2,2-diallyloxymethyl-1-butyl)bis (ditridecyl)phosphite titanate; bis(dioctyl pyrophosphato) oxyacetate titanate; bis(dioctyl pyrophosphato)ethylene titanate; isopropyl trioctanoyl titanate; isopropyl dimethacryl isostearoyl titanate; isopropyl isostearoyl diacryl titanate; isopropyl tri(dioctyl phosphato) titanate; isopropyl tricumylphenyl titanate; isopropyl tri(N-amidoethyl aminoethyl)titanate; dicumylphenyloxy acetate titanate; diisostearoyl ethylene titanate and the like.

In some embodiments, the coupling agent comprises 3-glycidoxypropyltrimethoxy silane having the following formula:

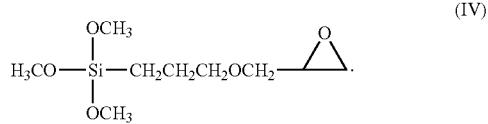

(IV)

The amount of the coupling agent can be from about 0.01 parts to about 10 parts, based on 100 parts by weight of the epoxy resin. In some embodiments, the amount of the coupling agent is from about 0.02 parts to about 7.5 parts, from about 0.04 parts to about 5 parts, from about 0.06 parts to about 2 parts, from about 0.08 parts to about 1 part, or from about 0.1 parts to about 0.75 parts by weight, based on 100 parts by weight of the epoxy resin. In other embodiments, the amount of the coupling agent is from about 0.2 parts to about 0.5 parts by weight, based on 100 parts by weight of the epoxy resin.

Optionally, the epoxy resin varnish or epoxy resin composition disclosed herein comprises a catalyst. Any catalyst that accelerates the curing of epoxy resins can be used herein. Some non-limiting examples of suitable catalysts include imidazoles, imidazolium salts, tertiary amines, an reaction product of a halogenobisphenol and a tertiary amine, an adduct of an imidazole and sulfur dioxide, $BF_3$-complex and combinations thereof. In certain embodiments, the epoxy resin varnish or epoxy resin composition disclosed herein does not comprise a catalyst.

In some embodiments, the catalyst is or comprises an imidazole. Any imidazole known in the art for catalyzing the curing of epoxy resins can be used herein. Some non-limiting examples of suitable imidazole catalysts include 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, isopropylimidazole, cyanide-containing derivatives of imidazoles (e.g., 1-cynoethyl-2-methylimidazole, 1-cyanoethyl-2-undecylimidazole, 1-cyanoethyl-2-ethyl-4-methylimidazole, and 1-cyanoethyl-2-phenylimidazole), azine-containing derivatives of imidazoles (e.g., 2,4-diamino-6-[2' methylimidazolyl-(1')]-ethyl-s-triazine, 2,4-diamino-6-[2'-undecylimidazolyl-(1)]-ethyl-s-trizine, 2,4-diamino-6-[2'-ethyl-4'-methylimidazolyl-(1)]-ethyl-s-triazine, 2,4-diamino-6-vinyl-1,3,5-triazine, and 2,4-diamino-6-methacryloyloxyethyl-1,3,5-triazine), hydroxyl-containing derivatives of imidazoles (e.g., 2-phenyl-4,5-dihydroxymethylimidazol, and 2-phenyl-4-methyl-5-hydromethylimidazole adduct), and adducts of an imidazole (e.g., 2,4-diamino-6-vinyl-1,3,5-triazine isocynauric acid, 2,4-diamino-6-methacryloyloxyethyl-1,3,5-trizine isocynuric acid adduct, epoxy-resin imidazole adduct, 2,4-diamino-6-[2'-methyl imidazolyl-(1)]-ethyl-s-trizine isocynauric acid adduct dehydrate, and 2-phenylimidazole isocynuric acid adduct). In other embodiments, the catalyst is or comprises 2-methylimidazole.

In certain embodiments, the catalyst is or comprises an imidazolium salt. Any imidazolium salt known in the art for catalyzing the curing of epoxy resins can be used herein. Some non-limiting examples of suitable include imidazolium salt catalysts include 1-cyanoethyl-2-undecylimidazolium-trimellitate, 1-cyanoethyl-2-phenylimidazolium-trimellitate, and 1-dodecyl-2-methyl-3-benzylimidazolium chloride.

In some embodiments, the catalyst is or comprises a tertiary amine. Any tertiary amine known in the art for catalyzing the curing of epoxy resins can be used herein. Some non-limiting examples of suitable tertiary amine catalysts include benzyldimethylamine, 2,2-(dimethylaminemethyl) phenol, 2,4,6-tris(dimethylaminemethyl)phenol, triethanolamine, triethylamine, triethylenediamine and combinations thereof.

In certain embodiments, the catalyst is or comprises a reaction product of a halogenobisphenol and a catalytically active amines. Any reaction product of a halogenobisphenol and a tertiary amine known in the art for catalyzing the curing of epoxy resins can be used herein. Some non-limiting examples of suitable halogenobisphenol include chlorinated, brominated, iodinated, or fluorinated bisphenol A, bisphenol B, bisphenol F, 4,4'-dihydroxydiphenyl or 4,4'-dihydrorxydiphenylsulfone. Some non-limiting examples of suitable catalytically active amines include the tertiary amines disclosed here, the imidazoles disclosed here and combinations thereof.

The amount of the catalyst can be from about 0.001 parts to about 5 parts, based on 100 parts by weight of the epoxy resin. In some embodiments, the amount of the catalyst is from about 0.002 parts to about 1 part, from about 0.003 parts to about 0.5 parts, from about 0.004 parts to about 0.1 parts, or from about 0.005 parts to about 0.05 part by weight, based on 100 parts by weight of the epoxy resin. In other embodiments, the amount of the catalyst is from about 0.005 parts to about 0.01 parts by weight, based on 100 parts by weight of the epoxy resin.

Optionally, the epoxy resin varnish or epoxy resin composition disclosed herein comprises a solvent. Any solvent that dissolves epoxy resins can be used herein. Some non-limiting examples of suitable solvents include ethylene glycol, a glycol ether, acetonitrile, ethyl acetate, acetone, methyl ethyl ketone, diethyl ether, tetrahydrofuran, dichloromethane, chloroform, N-methylpyrrolidinone, dimethyl formamide, dimethyl sulfoxide and combinations thereof. In some embodiments, the solvent is ethylene glycol. In other embodiments, the solvent is a glycol ether. In further embodiments, the solvent is a DOWANOL™ glycol ether commercially available from the Dow Chemical Company, Midland, Mich. In other embodiments, the epoxy resin varnish or epoxy resin composition disclosed herein does not comprise a solvent.

The amount of the solvent can be from about 0 part to about 100 parts, from about 1 part to about 80 parts, from about 2 parts to about 70 parts, from about 3 parts to about 60 parts, from about 4 parts to about 50 parts or from about 5 parts to about 40 parts by weight, based on 100 parts by weight of the epoxy resin. In some embodiments, the amount of the solvent is from about 10 parts to about 30 parts by weight, based on 100 parts by weight of the epoxy resin.

Provided herein is an epoxy resin varnish or an epoxy resin composition for making a laminate comprising an epoxy resin and an inorganic filler. In some embodiments, the inorganic filler is talc, silica or silicon dioxide, aluminum hydroxide, mica, kaolin, aluminum silicate, clay or a combination thereof.

The fillers used herein can provide prepregs and metal clad laminates having desirable properties such as good heat and humidity resistance, and improved insulation and mechanical properties. In some embodiments, the inorganic filler is talc, silica, aluminum hydroxide, mica, kaolin, aluminum silicate, clay, glass powder, glass microspheres, ballotini, alumina, silicon carbide, lime, bauxite, gypsum, calcium carbonate, barium sulfate, carbon black or graphite, flyash, cement dust, feldspar, nepheline, magnesium oxide, magnesium hydroxide, glass fibers, nano-clays, zinc oxide, calcium silicate, titanium dioxide, titanates, chalk or a combination thereof.

In certain embodiments, the inorganic filler is an ignition resistance filler selected from antimony oxide, decabromobiphenyl oxide, alumina trihydrate, magnesium hydroxide, borates, halogenated compounds and combinations thereof. In other embodiments, the inorganic filler is selected from glass fibers, synthetic fibers (e.g., polyolefin fibers), carbon fibers and combinations thereof.

In some embodiments, the inorganic filler is talc, silica or silicon dioxide, aluminum hydroxide, mica, kaolin, aluminum silicate, clay or a combination thereof. In other embodiments, the inorganic filler is substantially free of or free of talc, silica, aluminum hydroxide, mica, kaolin, aluminum silicate or clay. In further embodiments, the inorganic filler is substantially free of or free of talc.

In certain embodiments, the amount of the inorganic filler is from about 5 parts to about 30 parts by weight, based on 100 parts by weight of the epoxy resin. In other embodiments, the amount of the inorganic filler can be from about 0.5 parts to about 60 parts, from about 1 part to about 55 parts, from about 2 parts to about 50 parts, from about 3 parts to about 45 parts, from about 4 parts to about 40 parts, or from about 5 parts to about 35 parts by weight, based on 100 parts by weight of the epoxy resin. In some embodiments, the amount of the inorganic filler is from about 5 parts to about 30 parts by weight based on 100 parts by weight of the epoxy resin. In other embodiments, the amount of the inorganic filler is from about 12.5 parts to about 20 parts by weight based on 100 parts by weight of the epoxy resin.

In certain embodiments, the inorganic filler is a silica. In other embodiments, the silica is a crystalline silica, fumed silica, fused silica, amorphous silica (e.g., silica gel), hydrated silica or a combination thereof. In further embodiments, the silica is substantially free of or free of crystalline silica, fumed silica, fused silica, amorphous silica, or hydrated silica. In certain embodiments, the inorganic filler is a crystalline silica. Some non-limiting examples of suitable crystalline silica include α-quartz, β-quartz, β-tridymite, β-cristobalite, α-tridymite, α-cristobalite, β-cristobalite, keatite, coesite, stishovite, melanophlogite, and fibrous silica. The silica can be in any suitable physical form or shape such as ultra-fine powder, solid microspheres, hallow microspheres, flakes, disks, cylinders, hemispheres and the like. In further embodiments, the inorganic filler is substantially free of or free of hallow silica microspheres or solid silica microspheres. The silica disclosed herein can be further passivated or activated by surface-treating respectively with a surface inert or active agent such as silanes or surfactants.

The silica used herein can be classified as common silica, electrical-grade silica, electronic-grade silica, and active silica. In general, electrical-grade silica can be manufactured from high-quality quartz as raw material by special processes. They generally have a high silicon dioxide content, low ion content and low electric conductivity. In some embodiments, the inorganic filler used herein comprises electrical-grade silica micropowder. In some embodiments, the inorganic filler used herein comprises ultra-fine silica powder having an average particle size from about 0.5 microns to about 20 microns. In further embodiments, the silica is substantially free of or free of common silica, electrical-grade silica, electronic-grade silica, or active silica.

The amount of the silica disclosed herein can be from about 0.5 parts to about 60 parts, from about 1 part to about 55 parts, from about 2 parts to about 50 parts, from about 3 parts to about 45 parts, from about 4 parts to about 40 parts, or from about 5 parts to about 35 parts by weight, based on 100 parts by weight of the epoxy resin. In some embodiments, the amount of the silica is from about 5 parts to about 30 parts by weight based on 100 parts by weight of the epoxy resin. In other embodiments, the amount of the silica is from about 12.5 parts to about 20 parts by weight based on 100 parts by weight of the epoxy resin.

When used as a filler in the epoxy resin varnishes, epoxy resin compositions, prepregs or metal clad laminates disclosed herein, the inorganic filler (e.g., silica) has a water content of less than about 0.01%, less than about 0.1%, less than about 0.2%, less than about 0.3%, less than about 0.4%, less than about 0.5%, less than about 0.6%, less than about 0.7%, less than about 0.8%, less than about 0.9%, less than about 1%, less than about 1.5%, less than about 2%, less than about 2.5%, less than about 3%, or less than about 5% by weight. In some embodiments, the water content of the inorganic filler is less than about 2% by weight.

Generally, the water content of an inorganic filler is the quantity of water contained on the surface and in the pores of the inorganic filler. Any known method of measuring water content of solids can be used herein to measure the water content of the inorganic filler. For example, the water content can be measured directly measured using a known mass of a sample of the inorganic filler and a drying oven. The masses of the sample before and after drying in the oven are measured and the water content can be calculated from the masses. Alternatively, the water content of the inorganic filler can be measured by using Karl Fischer titration. Alternatively, the water content of the inorganic filler can be measured according to ASTM C 566, which is incorporated herein by reference.

When used as a filler, the silica has a purity of greater than about 99.5%, greater than about 95%, greater than about 96%, greater than about 97%, greater than about 98%, greater than about 99%, greater than about 99.1%, greater than about 99.3%, greater than about 99.5%, greater than about 99.7%, or greater than about 99.9%. In some embodiments, the silica has a purity of greater than about 99.5%.

In some embodiments, the inorganic filler disclosed herein is a silica having an average particle size from about 0.05 microns to about 20 microns, wherein the amount of the silica disclosed herein is from about 12.5 parts to about 20 parts by weight, based on 100 parts by weight of the epoxy resin disclosed herein. The average particle size of the inorganic filler (e.g., silica) can be from about 0.05 microns to about 100 microns, from about 0.1 microns to about 50 microns, from about 0.2 microns to about 40 microns, from about 0.3 microns to about 30 microns, from about 0.4 microns to about 25 microns. In some embodiments, the inorganic filler has an average particle size from about 0.5 microns to about 20 microns. In other embodiments, the inorganic filler has an average particle size of at most about 5 microns, at most about 10 microns, at most about 20 microns, at most about 30 microns, or at most about 40 microns. In further embodiments, the inorganic filler has an average particle size of at least about 0.01 microns, at least about 0.05 microns, at least about 0.1 microns, at least about 0.2 microns, at least about 0.3 microns, at least about 0.4 microns, at least about 0.5 microns, at least about 0.75 microns, or at least about 1 micron.

The average particle size and the particle size distribution of the inorganic filler can be measured with any particle size analyzer known to a skilled artisan. As used or claimed herein, the average particle size and the particle size distribution data are or should be measured by a LS-POP (VI) laser particle size analyzer commercially obtained from Zhuhai Omec Technology Co., Ltd., Zhuhai, China. The LS-POP (VI) laser particle size analyzer is based on light scattering and can measure particle size in the Range from 0.2 microns to 500 microns. Alternatively, the average particle size and the particle size distribution of the inorganic filler can be measured by an equivalent instrument or method that produces essentially the same results obtained by the LS-POP (VI) laser particle size analyzer.

The surface area of the inorganic filler can be determined by the BET (Brunauer-Emmet-Teller) method of measuring surface area, as described by S. Brunauer, P. H. Emmett, and E. Teller, Journal of the American Chemical Society, 60, 309 (1938), which is incorporated herein by reference. As used or claimed herein, the surface area data are or should be calculated from the nitrogen or argon adsorption isotherm data at 77° K. utilizing the BET method. The inorganic filler can have a surface area from about 1 $m^2/g$ to about 100 $m^2/g$, from about 5 $m^2/g$ to about 75 $m^2/g$, from about 10 $m^2/g$ to about 50 $m^2/g$, or from about 15 $m^2/g$ to about 30 $m^2/g$. In some embodiments, the inorganic filler has a surface area greater than 20 $m^2/g$, greater than about 40 $m^2/g$, or greater than about 60 $m^2/g$. In other embodiments, the inorganic filler has a surface area less than 20 $m^2/g$, less than about 15 $m^2/g$, or less than about 10 $m^2/g$.

In some embodiments, the inorganic filler is a silica having a water content of less than about 2%, a purity of greater than about 99.5% and an average particle size from about 0.05 microns to about 20 microns; and wherein the amount of the silica is from about 12.5 parts to about 20 parts by weight, based on 100 parts by weight of the epoxy resin. In further embodiments, the silica is an ultra-fine silica. In still further embodiments, the silica comprises silica microspheres. In still further embodiments, the silica is a crystalline silica, fumed silica, fused silica, amorphous silica (e.g., silica gel), hydrated silica or a combination thereof.

In one aspect, provided herein is a metal clad laminate comprising
 a) an insulating layer; and
 b) a metal layer on at least one surface of the insulating layer;
wherein the insulating layer comprising a cured epoxy resin composition and one or more glass fabrics embedded in the cured epoxy resin composition, and wherein the one or more glass fabrics are opened or flattened before embedded in the cured epoxy resin.

The epoxy resin varnish or epoxy resin composition disclosed herein can be prepared by mixing an epoxy resin, a curing agent, a coupling agent, a catalyst and an inorganic filler in a solvent. In some embodiments, the amount of the inorganic filler is from about 5 parts to about 30 parts by weight based on 100 parts by weight of the epoxy resin. In certain embodiments, the method of making epoxy resin varnish or epoxy resin composition comprises (1) adding an epoxy resin to a container or reactor equipped with a mixer or stirrer; (2) adding one or more inorganic fillers (e.g., silica and talc) to the container; (3) adding one or more curing agents (e.g., phenolic novolac) to the container; (4) adding one or more solvents to the container; (5) mixing or stirring the mixture; and (6) adding other ingredients such as one or more coupling agents and/or catalysts. These steps (1)-(6) may be practiced in any sequence or order. In some embodiments, steps (5) and (6) are reversed. In other embodiments, steps (1)-(4) can be practiced in any sequence or order. In further embodiments, steps (5) and (6) are reversed and steps (1)-(4) and (6) can be practiced in any sequence or order. In still further embodiments, epoxy resin varnish or epoxy resin composition disclosed herein is pumped to treating area to prepare prepregs.

The epoxy resin varnishes and epoxy resin compositions disclosed herein can be used to prepare prepregs, metal clad laminates and PCBs. In some embodiments, the prepregs comprise a partially cured epoxy resin composition comprising an epoxy resin, a curing agent, a coupling agent, a catalyst, and an inorganic filler, wherein the amount of the inorganic filler is from about 5 parts to about 30 parts by weight, based on 100 parts by weight of the epoxy resin. In some embodiments, the prepregs further comprises a reinforcement embedded in the partially cured epoxy resin composition. In some embodiments, the inorganic filler is substantially free of or free of talc.

Provided herein is a method of preparing a prepreg comprising:

(a) opening or flattening one or more glass fabrics;

(b) impregnating the one or more glass fabrics with an epoxy resin varnish; and (c) drying the impregnated one or more glass fabrics at a temperature from about 100° C. to about 250° C.

In some embodiments, the impregnated reinforcement is dried at a temperature from about 120° C. to about 225° C. from about 120° C. to about 225° C. or from about 80° C. to about 200° C. The drying time can be from about 1 minute to about 180 minutes, from about 2 minutes to about 120 minutes, from about 3 minutes to about 60 minutes, or from about 5 minutes to about 30 minutes, depending on the drying temperature.

In other embodiments, the prepregs are prepared by opening or flattening at least one reinforcement; impregnating the epoxy resin varnish disclosed herein into the at least one reinforcement; and then heat-drying the impregnated reinforcement to remove the solvent and partially curing the epoxy resins in the reinforcements. In further embodiments, the prepregs are prepared by opening or flattening one or more glass fabrics; impregnating the epoxy resin varnish disclosed herein into the one or more glass fabrics; and then heat-drying the impregnated one or more glass fabrics to remove the solvent and partially curing the epoxy resins in the one or more glass fabrics.

In further embodiments, the prepreg disclosed herein comprises an insulating layer. In certain embodiments, the insulating layer disclosed herein is prepared by impregnating the reinforcement with the epoxy resin varnish disclosed herein; and drying the impregnated reinforcement at a temperature from about 100° C. to about 250° C. In other embodiments, the reinforcement is one or more glass fabrics. In other embodiments, the one or more glass fabrics are opened or flattened before embedded in the epoxy resin varnish disclosed herein.

The prepreg can be prepared by any method known to a skilled artisan. In some embodiments, the prepreg is prepared by impregnating a reinforcement (e.g., glass clothes) with the epoxy resin varnish disclosed herein; and drying the impregnated reinforcement at a temperature from about 80° C. to about 300° C.; from about 100° C. to about 250° C., from about 120° C. to about 225° C. or from about 80° C. to about 200° C. The drying time can be from about 1 minute to about 180 minutes, from about 2 minutes to about 120 minutes, from about 3 minutes to about 60 minutes, or from about 5 minutes to about 30 minutes, depending on the drying temperature. In other embodiments, the prepregs are prepared by impregnating the epoxy resin varnish disclosed herein into at least one reinforcement and then heat-drying the impregnated reinforcement to remove the solvent and partially curing the epoxy resins in the reinforcements.

The amount of the epoxy resin in the prepreg is from about 1 wt. % to about 90 wt. %, from about 5 wt. % to about 80 wt. %, from about 10 wt. % to about 70 wt. %, or from about 15 wt. % to about 60 wt. %, based on the total weight of the prepreg. In some embodiments, the amount of the epoxy resin in the prepreg is at least 15 wt. %, at least 25 wt. %, at least 35 wt. %, at least 45 wt. %, or at least 50 wt. %. In other embodiments, the amount of the epoxy resin in the prepreg is at most 90 wt. %, at most 80 wt. %, at most 70 wt. %, at most 60 wt. %, or at most 50 wt. %. In addition, the condition for heating the reinforcements impregnated with the varnish is, for example, 80 to 150° C. for 1 to 10 minutes, but is not restricted thereto.

Also provided herein is a method of preparing a metal clad laminate comprising:

(a) opening or flattening one or more glass fabrics;

(b) impregnating the one or more glass fabrics with an epoxy resin varnish;

(c) drying the impregnated one or more glass fabrics at a temperature from about 100° C. to about 250° C. to form a prepreg; and (d) contacting a metal foil with at least a surface of the prepreg; and thermopress-bonding the metal foil to the surface of the prepreg.

Metal clad laminates may be produced using the prepregs disclosed herein by any method known to a skilled artisan. In other embodiments, the metal clad laminate having a metal foil on one side or two metal foils on both faces can be prepared by contacting a metal foil with at least a surface of the prepreg disclosed herein; and heat-pressing or thermopressing or thermopress-bonding the metal foil to the surface of the prepreg. In some embodiments, the metal is gold, silver, aluminum or copper. Laminates without metal such as copper may be produced using the prepregs disclosed herein by any method known to a skilled artisan Metal clad laminates may be produced using the prepregs disclosed herein by any method known to a skilled artisan. In other embodiments, the metal clad laminate having a metal foil on one side or two metal foils on both faces can be prepared by contacting a metal foil with at least a surface of the prepreg disclosed herein; and heat-pressing or thermopressing or thermopress-bonding the metal foil to the surface of the prepreg. In some embodiments, the metal is gold, silver, aluminum or copper. Laminates without metal such as copper may be produced using the prepregs disclosed herein by any method known to a skilled artisan.

In some embodiments, the metal of the metal clad laminate disclosed herein is copper. The copper foils for production of copper clad laminates may have a surface roughness from 0 micron to about 5 microns, from 0.05 microns to about 4 microns, from 0.1 microns to about 3 microns, or from 0.15 microns to about 2 microns.

The copper surface contacting with the prepreg may be surface-treated to prevent corrosion and/or improve adhesiveness with the surface of the prepreg. In certain embodiments, the copper surface may be treated with zinc or a zinc alloy. For the treatment of copper foils with zinc or a zinc alloy, zinc or the zinc alloy may be deposited onto the surface of the copper foil by means of, for example, plating. In other embodiments, the copper surface may be treated with a coupling agent such as a vinyl group-containing silane coupling agent.

In some embodiments, the metal clad laminate comprises a resin layer comprising a cured epoxy resin composition; and a metal layer on at least one main surface of the resin layer, wherein the epoxy resin composition comprising an epoxy resin, a curing agent, a coupling agent, a catalyst, and an inorganic filler, and wherein the amount of the inorganic filler is from about 5 parts to about 30 parts by weight based on 100 parts by weight of the epoxy resin. In some embodiments, the inorganic filler is substantially free of or free of talc.

The metal layer disclosed herein can be formed on the resin layer by any known method such as electroplating, sputtering, evaporation, atomic layer deposition, laminating with a metal foil, and screen printing or ink jet printing with an ink comprising nano-metal particles.

Figure 4:
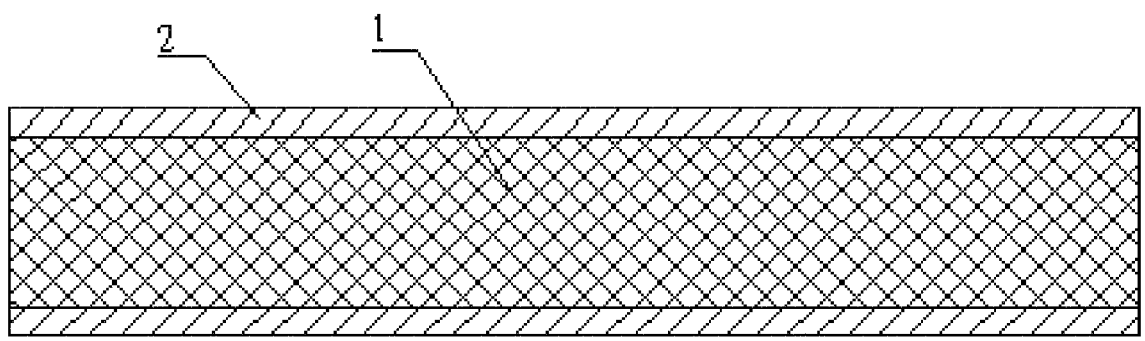
FIG. 4 illustrates a cross-sectional view of one embodiment of a CCL, wherein the CCL comprises an insulating layer 1 and a metal layer 2 on at least one surface of the insulating layer.

FIG. 4 illustrates a cross-sectional view of one embodiment of a CCL, wherein the CCL comprises an insulating layer 1 and a metal layer 2 on at least one surface of the insulating layer.

In other embodiments, the metal clad laminate is a double-sided copper clad laminate having a copper layer on each of the two main surfaces of the resin layer. In some embodiments, the inorganic filler in the metal clad laminate is talc, silica, aluminum hydroxide, mica, kaolin, aluminum silicate, clay or a combination thereof. In some embodiments, the inorganic filler in the metal clad laminate is a silica having a water content of less than about 2%, a purity of greater than about 99.5% and an average particle size from about 0.05 microns to about 20 microns; and wherein the amount of the silica is from about 12.5 parts to about 20 parts by weight, based on 100 parts by weight of the epoxy resin.

The single-side or double-side copper clad laminates can be manufactured by a process in which an electrodeposited or rolled copper foil is superposed on one surface of the prepregs, or such prepregs are sandwiched between two such copper foils, and the resulting assembly is lamination molded. In certain embodiments, multilayered PCBs having an inner-layer printed circuit are manufactured by a process in which the above copper clad laminate is combined with an inner-layer board having formed thereon a printed circuit for inner layer use and further with prepregs and either a copper foil or a single-side copper clad laminate and the resulting assembly is subjected to lamination molding to give a multi-layered board both sides of which are constituted by a copper foil, and this multilayered board is subjected to processing steps such as steps for forming through-holes, outer-layer printed circuits, and the like. In some embodiments, multi-layered metal clad laminates having a metal foil on one side or two metal foils on both faces can be produced by (1) stacking one or more prepregs disclosed herein; (2) placing on one or both sides metal foils such as copper foil or the like; and (3) heat-pressing or thermo-pressing or thermopress-bonding the resulting stack.

PCBs can be prepared from the metal clad laminates disclosed herein by etching the metal foils to form a circuit pattern on the metal layer of the metal clad laminates. In some embodiments, the metal is copper. In other embodiments, multilayer PCBs can be prepared by using this PCBs as internal layer PCBs, providing a surface treatment to the metal foils thereon, stacking multiple sheets thereof while interposing a prepreg disclosed herein between them, laying metal foils on the utmost faces of the stack, and heat-pressing the resulting entire stack. The heat-pressing condition may vary according to the formulation of the epoxy resin composition disclosed herein. In certain embodiments, these stacks are heat-pressed under a condition of a temperature in the range of 170° C. to 230° C. and a pressure from about 1.0 MPa to about 6.0 MPa (about 10 kg/cm$^2$ to about 60 kg/cm$^2$) for a suitable period. The metal clad laminates and PCBs obtained in this manner have improved processability, water resistance, humidity resistance, moisture and heat resistance, electrical resistivity and dimension stability.

In general, in digital electronics, a stream of binary values is represented by a voltage (or current) waveform. Signal integrity is generally a measure of the quality of an electronic signal. The signal integrity of a PCB is characterized by the eye diagram and insertion loss. Generally, the signal strength is revealed in the eye diagram, i.e., eye height (mV). Insertion loss of PCB is in the form of signal loss (dB/in). In some embodiments, the PCB made from the opened or flattened glass fiber cloth disclosed herein transmits electronic signals in a higher signal transmission velocity, compared to the a PCB made from a normal glass fiber cloth. In other embodiments, the PCB made from the opened or flattened glass fiber cloth disclosed herein transmits electronic signals with higher signal integrity, compared to the a PCB made from a normal glass fiber cloth. In further embodiments, the signal loss from a PCB made from the opened or flattened glass fiber cloth disclosed herein is lower than the signal loss from a PCB made from a normal glass fiber cloth. Generally, a signal transmission medium with higher homogeneity lowers the offset of the metal clad laminates. In general, electronic signals transmit with signal transmission velocities and lower signal loss in a homogeneous signal transmission medium. In further embodiments, a PCB made from an opened or flattened glass fiber cloth disclosed herein provides a signal transmission medium with a higher homogeneity, compared to a PCB made from a normal glass fiber cloth.

In certain embodiments, the warp and weft yarn of the opened or flattened glass fabrics disclosed herein is flat. In other embodiments, the contact surface area between the opened or flattened glass fabrics disclosed herein and the epoxy resin vanish is higher than the contact surface area between a normal glass fiber cloth and the epoxy resin vanish. In further embodiments, the time for embedding the opened or flattened glass fabrics disclosed herein in the epoxy resin vanish is shorter than the time for embedding a normal glass fiber cloth in the epoxy resin vanish. In still further embodiments, a PCB made from an opened or flattened glass fiber cloth disclosed herein has a higher thermal stress, compared to a PCB made from a normal glass fiber cloth. In some embodiments, a PCB made from an opened or flattened glass fiber cloth disclosed herein has a higher thermal resistance, compared to a PCB made from a normal glass fiber cloth. In other embodiments, the cost of preparing a PCB made from an opened or flattened glass fiber cloth disclosed herein is lower than the cost of preparing a PCB made from a normal glass fiber cloth.

Figure 5A:
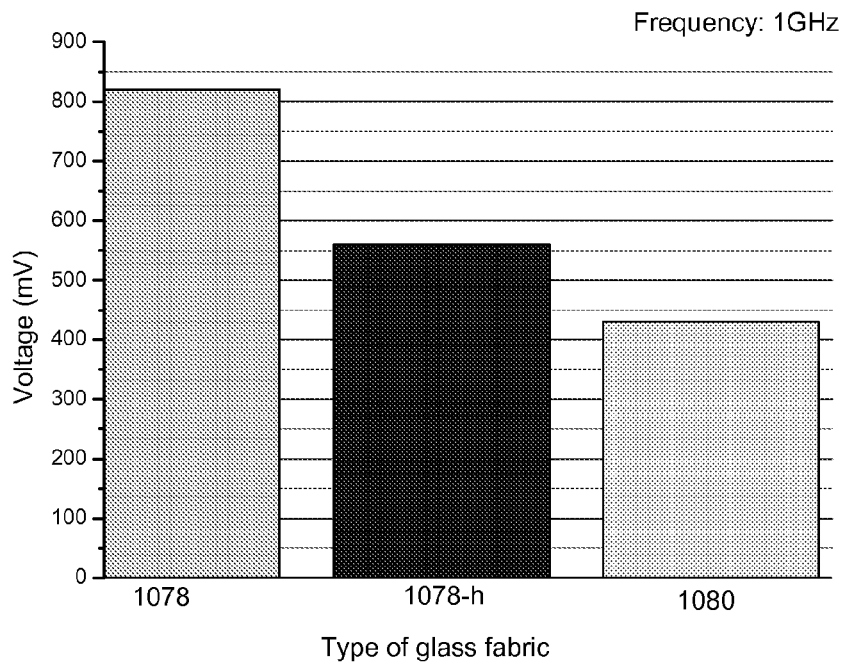
FIG. 5A shows an eye diagram of a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 1 GHz.
Figure 5B:
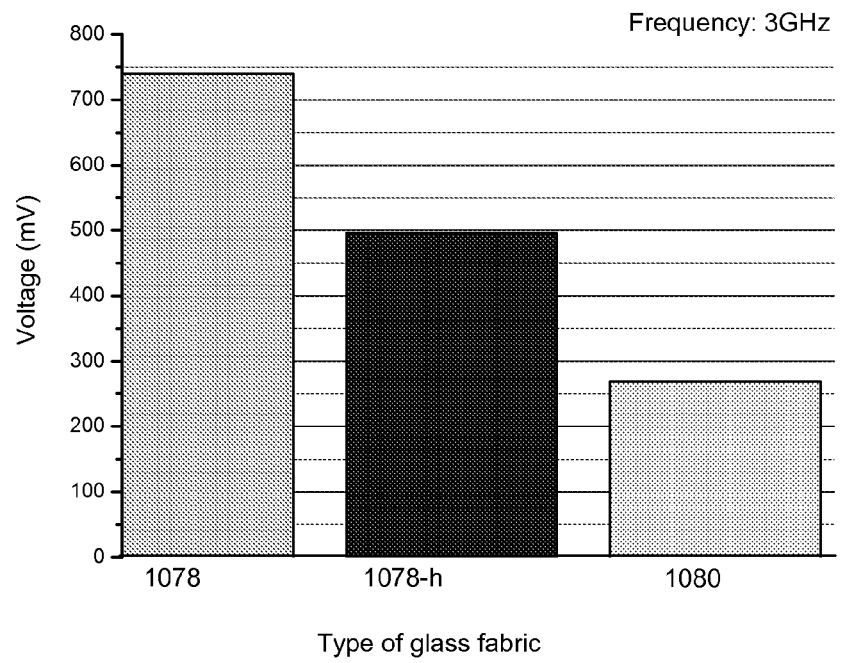
FIG. 5B shows an eye diagram of a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 3 GHz.

FIG. 5A shows an eye diagram of a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 1 GHz. FIG. 5B shows an eye diagram of a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 3 GHz. As shown in FIGS. 5A and 5B, a higher voltage was transmitted by the PCB made from the opened glass fiber cloth and the PCB made from the half-opened glass fiber cloth than the PCB made from the normal glass fiber cloth at both 1 and 3 GHz.

Figure 6A:
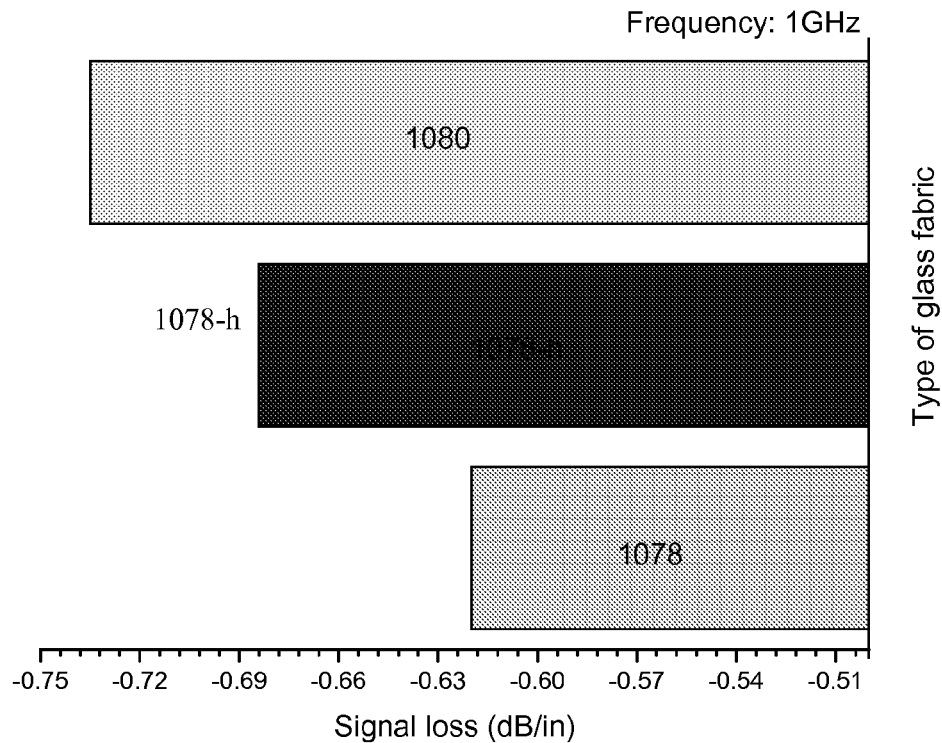
FIG. 6A depicts the signal loss from a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 1 GHz.
Figure 6B:
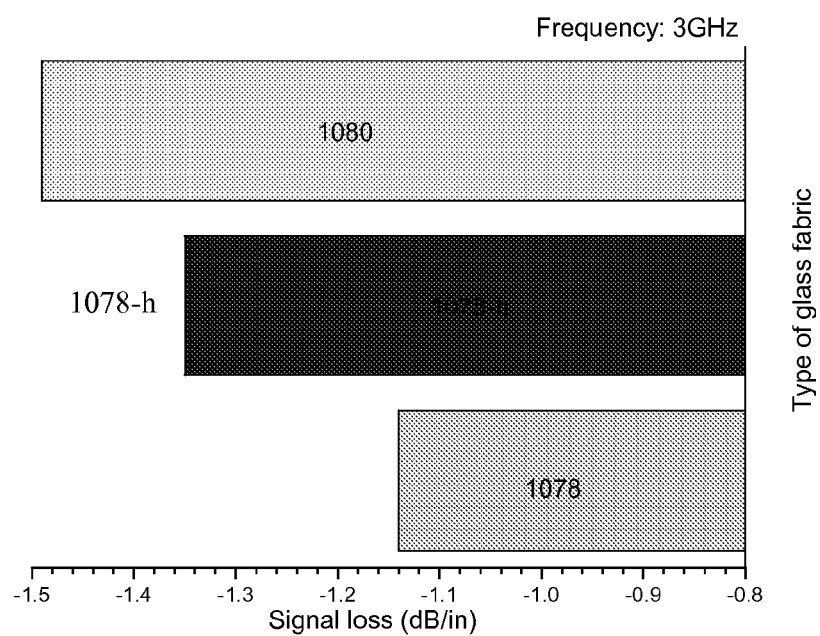
FIG. 6B depicts the signal loss from a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 3 GHz.

FIG. 6A depicts the signal loss from a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 1 GHz. FIG. 6B depicts the signal loss from a PCB made from an opened glass fiber cloth (i.e., 1078), a PCB made from a half-opened glass fiber cloth (i.e., 1078-h), and a PCB made from a normal glass fiber cloth (i.e., 1080), analyzed at a frequency of 3 GHz. As shown in FIGS. 6A and 6B, the PCB made from the opened glass fiber cloth and the PCB made from the half-opened glass fiber cloth have lower signal losses than the PCB made from the normal glass fiber cloth at both 1 and 3 GHz.

The peel strength of the metal clad laminates disclosed herein can be measured according to IPC-TM-650 2.4.8, which is incorporated herein by reference. In some embodiments, the peel strength of the metal clad laminates is at least about 6 lb/in or at least about 6.5 lb/in for 1 oz copper foil. In other embodiments, the peel strength is at least about 7 lb/in, at least about 7.5 lb/in, at least about 8 lb/in, at least about 8.5 lb/in, at least about 9 lb/in, or at least about 9.5 lb/in for 1 oz copper foil. In further embodiments, the peel strength is at least about 10 lb/in, at least about 10.5 lb/in, at least about 11 lb/in, or at least about 11.5 lb/in, at least about 12 lb/in for 1 oz copper foil.

The dimension stability or change of the laminates disclosed herein can be measured by any known method such as thermomechanical analysis. The dimension stability and linear, area or volumetric coefficients of thermal expansion of the prepregs and laminates disclosed herein can be improved by the inorganic filler disclosed herein. In some embodiments, the linear coefficient of thermal expansion in the thickness direction (Z-CTE) of the laminate is less than 100 ppm/° C., less than 90 ppm/° C., less than 80 ppm/° C., less than 70 ppm/° C., or less than 60 ppm/° C. before the glass transition temperature (Tg) of the laminates. In other embodiments, the Z-CTE of the laminate is less than 400 ppm/° C., less than 300 ppm/° C., less than 250 ppm/° C., less than 240 ppm/° C., less than 230 ppm/° C., less than 220 ppm/° C., or less than 210 ppm/° C. after Tg. In further embodiments, the volumetric coefficient of thermal expansion of the prepreg or laminate is in the range from about $1\times10^{-4}$/K to about $1\times10^{-7}$/K, from about $5\times10^{-5}$/K to about $2\times10^{-7}$/K, from about $4\times10^{-5}$/K to about $3\times10^{-7}$/K, or from about $3\times10^{-5}$/K to about $4\times10^{-7}$/K at 20° C.

The volume and surface resistivities of the laminates disclosed herein can be measured according to IPC-TM-650 2.5.17.1, which is incorporated herein by reference. The resistivities of the laminates disclosed herein can be improved by the inorganic filler disclosed herein. In some embodiments, the volume resistivity of the laminate is in the range from about $1\times10^3$ MΩ-cm to about $1\times10^7$ MΩ from about $1\times10^3$ MΩ-cm to about $1\times10^6$ MΩ from about $1\times10^3$ MΩ-cm to about $1\times10^5$ MΩ or from about $1\times10^3$ MΩ-cm to about $1\times10^4$ MΩ-cm. In other embodiments, the surface resistivity of the laminates disclosed herein can be in the range from about $1\times10^3$ MΩ to about $1\times10^6$ MΩ from about $1\times10^3$ MΩ to about $1\times10^5$ MΩ or from about $1\times10^3$ MΩ to about $1\times10^4$ MΩ.

The water absorption of the laminates disclosed herein can be measured according to IPC-TM-650 2.6.2.1, which is incorporated herein by reference. In some embodiments, the water absorption of the laminate is less than about 2%, less than about 1.75%, less than about 1.5%, less than about 1.2%, less than about 1%, less than about 0.9%, less than about 0.8%, less than about 0.7%, less than about 0.5%, less than about 0.4%, less than about 0.3%, less than about 0.2%, less than about 0.19%, less than about 0.18%, less than about 0.17%, less than about 0.16%, or less than about 0.15%.

The dielectric constant and dissipation factor of the metal clad laminates disclosed herein can be measured according to IPC-TM-650 2.5.5.2, which is incorporated herein by reference. In some embodiments, the dielectric constant of the prepreg or laminate is less than about 5.4, less than about 5, less than about 4.75, less than about 4.5, or less than about 4, measured at 250 MHz.

The thermal decomposition temperature of the laminates disclosed herein can be measured according to IPC-TM-650 2.4.24.6, which is incorporated herein by reference. In some embodiments, the thermal decomposition temperature of the laminate is at least about 290° C., at least about 310° C., at least about 325° C., or at least about 340° C.

The tensile strength, elongation and Young's modulus of the laminates disclosed herein can be measured according to IPC-TM-650 2.4.18.3, which is incorporated herein by reference. In some embodiments, the Young's modulus of the laminate is at least about 16 GPa, at least about 17 GPa, at least about 18 GPa, at least about 19 GPa, at least about 20 GPa, at least about 21 GPa, at least about 22 GPa, at least about 23 GPa, at least about 24 GPa, or at least about 25 GPa.

The thermal stress of the laminates disclosed herein can be measured according to IPC-TM-650 2.4.13.1, which is incorporated herein by reference. In some embodiments, the thermal stress of the laminate is at least about 1 time, at least about 5 times, at least about 10 times, at least about 15 times, at least about 20 times, at least about 25 times, or at least about 30 times, measured at 288° C. in 10 seconds.

The flammability of the laminates disclosed herein can be measured according to UL 94, which is incorporated herein by reference.

EXAMPLES

In the following examples, efforts have been made to ensure accuracy with respect to numbers used (for example, amounts, temperature, and so on), but variation and deviation can be accommodated, and in the event a clerical error in the numbers reported herein exists, one of ordinary skill in the arts to which this invention pertains can deduce the correct amount in view of the remaining disclosure herein. All reagents, unless otherwise indicated, were obtained commercially. The following examples are intended for illustrative purposes only and do not limit in any way the scope of the present invention.

Testing Procedures of Glass Fabrics

Air Permeability Test

The air permeability of the one or more glass fabrics prepared herein are measured according to JIS L 1096, which is incorporation herein by reference.

The first step of testing the air permeability of the one or more glass fabrics is to turn on the power switch 35 of the Frazile Type Textile Air Permeability Tester (Model: AP-360), provided that the rheostat 26 had been swirled to the leftmost. The power 36 was then lighted up.

A specimen of the one or more glass fabrics was placed on the top of the opening 38 followed by setting an appropriate tension on the specimen by setting the sample setting ring 113. The stand gripe 115 was lowered and the specimen was fixed at the appropriate position by the lock 111. The stand lock 114 was used to affix the stand gripe 115 at an inclined position. When the stand gripe 115 was affixed at an inclined position, the stand lock 114 was opened by pushing the stand gripe 115 towards the back 37. The stand gripe 115 can then be lowered to its horizontal position.

An appropriate orifice 28 was selected according to an expected air permeability of the specimen. For specimens with unknown air permeabilities, a larger orifice 28 was first used, followed by the subsequent tests using smaller orifices. The handle 33 was pulled away from the back 37 so as to pull out the orifice setting plate 27. The orifice 28 having a diameter of about 6 cm or an orifice 28 having a diameter of about 8 cm was tightly screwed into the bottom of the orifice setting plate 27. After setting up the orifice 28, the handle 33 was pushed towards the back 37 so as to set the orifice setting plate 27 into its original position, until it was in contact with the back 37.

The rheostat 26 was slowly swirled in a clockwise direction until an indication of 12.7 mm was shown in the inclined water manometer 11. The amount of air was then set properly. If the reading of a vertical water manometer 15 remains zero when the inclined water manometer 11 points to 12.7 mm, the orifice 28 used for the specimen was too large and a smaller orifice 28 should be used. If the reading of the vertical water manometer 15 exceeds 400 mm before the inclined water manometer 11 points to 12.7 mm, the orifice 28 used for the specimen was too small and a larger orifice 28 should be used. The rheostat 26 should be swirled slowly, otherwise, water in the vertical water manometer 15 may flow into the rectifier 29 and the tube 30, affecting the test of air permeability.

Air permeability data were taken when the reading of the vertical water manometer 15 was maintained from about 75 mm to about 400 mm and the reading of the inclined water manometer 11 was maintained at about 12.7 mm. If the reading of the vertical water manometer 15 fell outside the range from about 75 mm to about 400 mm when the reading of the inclined water manometer 11 was maintained at about 12.7 mm, a smaller orifice 28 was then used. The reading of the vertical water manometer 15 was maintained from about 75 mm to about 400 mm when the air permeability data were taken for the consistency and reliability of data.

The air permeability of the specimen can be read from FIG. 3 of JIS L 1096 by using the size of the orifice 28 and the reading of the vertical water manometer 15. Tests for the air permeability of the specimen were repeated for 5 times. Results of the 5 tests were averaged and corrected to 1 decimal place.

Testing Procedures of Copper Clad Laminates

Peel Strength

The peel strength of the copper clad laminates prepared herein was measured according to IPC-TM-650 2.4.8. Apparatus and chemicals required for the peel strength test include a tensile tester equipped with a load cell, capable of measuring to the nearest 5 kg, a solder pot, a specimen hold-down clamping system, organic chemical stripper (e.g., methylene chloride), sodium hydroxide, boric acid, sulfuric acid, organic degreaser (e.g., isopropyl alcohol), hot fluid bath, Dow Silicone Fluid no. 704 and Dow Silicone Grease.

Specimens of the copper clad laminates were cut into 3.18 mm test strips. A minimum of two test strips per specimen were peeled. For testing peel strength of materials as received, the specimen was fasten down and an unencumbered vertical pull was exerted. Force was applied in the vertical direction at the rate of about 50.8 mm/minute until at least a 25.4 mm peel was completed. For testing peel strength after thermal stress, a thin coating of silicon grease was applied to the specimen and float on solder pot maintained at about 288° C. for about 10 seconds.

Evaluation of the specimen was performed by normal or corrected 20/20 vision to record loss of surface resin, discoloration, resin softening, delamination, blistering, propagation of imperfections, measling, crazing, or voids. The peel strength was calculated as per the formula: peel strength (in lbs/in)=$L_M/W_S$, where $L_M$ was the minimum load and $W_S$ was measured width of the peel strip.

Thermal Decomposition

The thermal decomposition of the copper clad laminates prepared herein was measured according to IPC-TM-650 2.4.24.6. The thermogravimetry analyzer (TGA) was equipped with a null type microbalance, sensitive to 0.001 mg, a furnace equipped with dry nitrogen purge and a temperature programmer capable of providing controlled about 10° C. per minute heating rate from 30° C. to about 550° C. The gas purge was generally ran for 30 minutes before inserting a sample and the instrument was calibrated with the same flow rate as used during the test.

During the test, a sample was weighed (from about 10 mg to about 30 mg) and placed in the TGA. The sample was heated at a rate of 10° C./minute from <50° C. to about 550° C. $T_d$ (2%) data were taken when the sample was 2.0% less than its mass measured at 50° C. $T_d$ (5%) data were taken when the sample was 5.0% less than its mass measured at 50° C.

Water Absorption

The water absorption of the copper clad laminates prepared herein was measured according to IPC-TM-650 2.6.2.1. Three test specimens were prepared to about 2 inches long by 2 inches wide by the thickness of the material with edges milled or sand smoothed with 400 grit. The metal cladding was removed by etching per IPC-TM-650, Methods 2.3.6, 2.3.7 or 2.3.7.1. The apparatus required was a circulating air oven capable of maintaining a uniform temperature of about 105° to 110° C. and a desiccator capable of maintaining less than 21+/−2% R.H. at about 20° C.

The specimens were conditioned by the drying oven for 1 hour, cooled to room temperature in a desiccator and weighed immediately. The specimens were immersed in a container of distilled water maintained at about 23+/−1° C. for about 24+/−0.5 hours. The specimens were then cloth dried and weighed immediately. The water absorption was the percentage increase in weight for each specimen calculated according to IPC-TM-650 2.6.2.1.

Dielectric Constant and Dissipation Factor

The dielectric constant and dissipation factor of the copper clad laminates prepared herein were according to IPC-TM-650 2.5.5.2. Each specimen was about 50.8+/−0.75 mm×50.8+/−0.75 mm by thickness of laminate or reinforcement material. Both sides of the specimens were coated with one uniform coating of silver conductive paint. The specimens were air dried until dry to touch and oven-dried at about 50+/−2° C. for 30 minutes and cool in a desiccator. A 25.4 mm diameter disc was punched or machined into the specimens which were conditioned for a minimum of 40 hours at about 23+/−5° C. at relative humidity of about 50%. The specimen was placed onto the meter and the dissipation factor was read on the display. The dielectric constant was calculated according to IPC-TM-650 2.5.5.2.

Thermal Stress

The thermal stress of the copper clad laminates prepared herein was measured according to IPC-TM-650 2.4.13.1. For each clad side and test condition, three specimens were used for qualification testing and two specimens for lot acceptance testing. Each specimens was about 50.8+/−0.75 mm×50.8+/−0.75 mm by the thickness of the laminate. Half of the metallic clad laminate sampling was completely etched in accordance with standard industry practices.

The series of apparatus required to perform this test included an air circulating oven capable of maintaining a temperature of about 125±2° C., a thermostatically controlled electrically heated solder pot containing at least 1.0 kg of solder of about 288±0.5° C., a thermocouple or other device capable of measuring the solder temperature at a depth of 25.4 mm, a desiccation chamber capable of maintaining an atmosphere less than 30% RH at 23° C. and a series of optical magnification equipments.

The sample was first conditioned in the air-circulating oven for 4 to 6 hours and placed in a desiccators and allowed to cool to room temperature, subsequently fluxed with rosin flux and drained in a vertical position. The specimen was then float for about 10+1/−0 seconds on the surface of a solder bath maintained at specified temperatures. The specimens were kept in intimate contact with the solder surface and agitated by gentle downward pressure using tongs or equivalent. The specimens were then cooled to room temperature. Evidence of charring, surface contamination, loss of surface resin, resin softening, delamination, blistering, weave exposure, propagation of imperfection, measling, crazing, voids, blistering, delamination (e.g., bumps) or other damages were recorded.

Flammability Test

The flammability of the copper clad laminates prepared herein was measured according to UL 94. The UL94 is a test which determines the material's burning characteristics after test specimens have been exposed to a specified test flame under controlled laboratory conditions. Twelve flame classifications were used to categories results, 6 of which relate to materials commonly used in manufacturing enclosures, structural parts and insulators found in consumer electronic products (5VA, 5VB, V-0, V-1, V-2, HB); 3 of which relate to low-density from materials commonly used in fabricating speaker grills and sound-deadening material (HF-1, HF-2, HBF); the final 3 relate to very thin films, generally not capable of supporting themselves in a horizontal position, usually found in substrates on PCBs (VTM-0, VTM-1, VTM-2).

The test was conducted by placing test specimens molded from plastic materials orientated in either horizontal or vertical positions, and were subjected to a defined flame ignition source for a specified period of time. In a horizontal burning test, the result was the rate less than a specified maximum when the material was burned horizontally. In vertical burning, the result was the time taken for the material to self-extinguished after the ignition source was removed and the tendency of the specimen to ignite a cotton indicator located below the sample by dripping flaming particles.

Preparations of Examples 1-2 and Comparative Example A

The glass fabrics used for Comparative Example A, Example 1, and Example 2 are 1080 glass fabric (a normal glass fabric), 1078 glass fabric (an opened glass fabric) and 1078-h glass fabric (a half-opened glass fabric) respectively. The table below depicts some mechanical and physical properties of the 1078, 1078-h and 1080 glass fabrics.

| Property | Unit | 1078-h | 1078 | 1080 |
|---|---|---|---|---|
| width | mm | 1281 | 1280 | 1276 |
| Basic Weight | g/m$^2$ | 47.48 | 47.56 | 47.18 |
| Width of feather edge | mm | 5 | 5 | 3 |
| Thickness | mm | 55 | 50 | 58 |
| Tensile strength (warp) | kg/25 mm | 22.30 | 20.05 | 20.97 |
| Tensile strength (fill) | kg/25 mm | 17.92 | 19.48 | 13.95 |
| Thread count (warp) | yard | 54 | 54 | 59.5 |
| Thread count (fill) | yard | 53 | 53 | 47 |
| Air permeability | cm$^3$/cm$^2$/sec | 58.23 | 21.67 | 187.33 |
| Bend of Fill | mm/300 mm | 0.40 | 1.01 | 0.93 |
| Loss on ignition | % | 0.12 | 0.11 | 0.11 |

Each of Comparative Example A, Example 1, and Example 2 was prepared according to the general procedure as follows. The first step of making the laminate is the preparation of the epoxy resin composition. The formulation of the epoxy resin compositions comprise epoxy resin (Dow Chemical, XQ82937, bromine content 11.3%) 125 g; epoxy resin (Grace Epoxy, GEBR555A75, Bromine content 18-21) 271 g; polyfunctional epoxy resin (Hexion Specialty Chemicals, 1031) 4 g; RTC39 (Dow Chemical, Phenolic novolac resin cruing agent) 8 g; KPH-L2003 (Kolon, phenolic novolac resin curing agent) 127 g; and 2-methylimidazole 0.153 g. At about 35° C., the epoxy resins, curing agent, coupling agent, catalyst, solvent and inorganic filler were added into a container and the mixture was mixed to form the epoxy resin varnish.

The second step of making the copper clad laminate was opening or flattening a glass fiber cloth. The glass fiber cloth was processed by high pressure water jet acupuncture. Yarn having a diameter of from about 4 μm to about 6 μm was twisted to form a glass fiber cloth. The warp density of the glass fiber cloth was from about 54 thread/inch to about 95 thread/inch. The weft density was from about 54 thread/inch to about 95 thread/inch. The thickness of the glass fiber cloth was from about 0.5 μm to about 2.8 μm. The range of weight of the yarn is from about 12 gram/m$^2$ to about 80 gram/m$^2$.

The third step of making the copper clad laminate was impregnation. A glass fiber cloth was impregnated and heated in an oven temperature at about 150° C. to about 250° C. until it has become a prepreg. The line speed of the prepreg making machine for making the prepreg was from about 6 m/minute to about 12 m/minute. The gel time was from about 60 seconds to about 90 seconds. In some embodiments, the gel time was from about 160 seconds to about 300 seconds. The resin content was from about 40% to about 80%. The resin flow was from about 20% to about 50%. The volatile content was lower than about 0.75%.

The fourth step of making the copper clad laminate was hot pressing. After the prepreg was cut into the required size, the prepreg was laminated with a copper foil. Hot pressing was performed on the laminate to form a copper clad laminate. The conditions of the hot pressing step were set at a vacuum of 40 torr at a press pressure from about 20 kg/cm$^2$ to about 35 kg/cm$^2$. The hot press was set at a temperature from about 50° C. to about 240° C. and the temperature ramping rate was from about 1.0° C./minute to about 3.0° C./minute. The curing time was from about 45 minutes to about 90 minutes and the press time was from about 120 minutes to about 240 minutes.

While the invention has been described with respect to a limited number of embodiments, the specific features of one embodiment should not be attributed to other embodiments of the invention. No single embodiment is representative of all aspects of the claimed subject matter. In some embodiments, the compositions or methods may include numerous compounds or steps not mentioned herein. In other embodiments, the compositions or methods do not include, or are substantially free of or free of, any compounds or steps not enumerated herein. Variations and modifications from the described embodiments exist. It is noted that the methods disclosed herein are described with reference to a number of steps. These steps can be practiced in any sequence. One or more steps may be omitted or combined but still achieve substantially the same results. The appended claims intend to cover all such variations and modifications as falling within the scope of the invention.

All publications and patent applications mentioned in this specification are herein incorporated by reference to the same extent as if each individual publication or patent application was specifically and individually indicated to be incorporated by reference. Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A metal clad laminate comprising:
a) an insulating layer; and
b) a metal layer on at least one surface of the insulating layer;

wherein the insulating layer comprising a cured epoxy resin composition and one or more glass fabrics in the cured epoxy resin composition, and wherein the air permeability of the one or more glass fabrics is more than 20 cc/cm$^2$/sec and less than about 90 cc/cm$^2$/sec.

2. The metal clad laminate of claim 1, wherein the air permeability of the one or more glass fabrics is from about 25 cc/cm$^2$/sec to about 85 cc/cm$^2$/sec.

3. The metal clad laminate of claim 1, wherein the air permeability of the one or more glass fabrics meets the JIS L 1096 specification.

4. The metal clad laminate of claim 1, wherein the thickness of the one or more glass fabrics is from about 30 μm to about 60 μm.

5. The metal clad laminate of claim 1, wherein the thickness of the one or more glass fabrics is from about 45 μm to about 55 μm.

6. The metal clad laminate of claim 1, wherein a width of the warp yarn of the one or more glass fabrics is from about 0.235 mm to about 0.265 mm and a width of the weft yarn of the one or more glass fabrics is from about 0.295 mm to about 0.325 mm.

7. The metal clad laminate of claim 1, wherein the metal is copper.

8. The metal clad laminate of claim 1, wherein the metal clad laminate is a double-sided copper clad laminate having a copper layer on each of the two main surfaces of the resin layer.

9. The metal clad laminate of claim 1, wherein the epoxy resin composition comprises an epoxy resin, a curing agent, a coupling agent, a catalyst, and an inorganic filler.

10. The metal clad laminate of claim 1 wherein the one or more glass fabrics are reprocessed by spraying with a high pressure water jet to lower the air permeability of the one or more glass fabrics before embedded in the epoxy resin composition.

11. The metal clad laminate of claim 10, wherein the air permeability of the one or more glass fabrics is from about 25 cc/cm$^2$/sec to about 85 cc/cm$^2$/sec.

12. The metal clad laminate of claim 10, wherein a width of the warp yarn of the one or more glass fabrics is from about 0.235 mm to about 0.265 mm and a width of the weft yarn of the one or more glass fabrics is from about 0.295 mm to about 0.325 mm.

13. The metal clad laminate of claim 10, wherein the metal is copper.

14. The metal clad laminate of claim 10, wherein the metal clad laminate is a double-sided copper clad laminate having a copper layer on each of the two main surfaces of the resin layer.

15. The metal clad laminate of claim 10, wherein the epoxy resin composition comprises an epoxy resin, a curing agent, a coupling agent, a catalyst, and an inorganic filler.

* * * * *

UNITED STATES PATENT AND TRADEMARK OFFICE
CERTIFICATE OF CORRECTION

| | | |
|---|---|---|
| PATENT NO. | : 8,119,225 B2 | Page 1 of 1 |
| APPLICATION NO. | : 12/700725 | |
| DATED | : February 21, 2012 | |
| INVENTOR(S) | : Peng et al. | |

It is certified that error appears in the above-identified patent and that said Letters Patent is hereby corrected as shown below:

Title page at (73), please change "New District, Sushou, Jiangsu" to -- New District, Suzhou, Jiangsu --

Column 30, line 7, please change "in the epoxy" to -- in the cured epoxy --

Signed and Sealed this
Seventeenth Day of April, 2012

David J. Kappos
*Director of the United States Patent and Trademark Office*